(12) United States Patent
Houston

(10) Patent No.: US 6,710,391 B2
(45) Date of Patent: Mar. 23, 2004

(54) INTEGRATED DRAM PROCESS/ STRUCTURE USING CONTACT PILLARS

(75) Inventor: Theodore W. Houston, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 7 days.

(21) Appl. No.: 10/180,140

(22) Filed: Jun. 26, 2002

(65) Prior Publication Data

US 2004/0000686 A1 Jan. 1, 2004

(51) Int. Cl.$^7$ .............................................. H01L 31/119
(52) U.S. Cl. ...................... 257/306; 257/295; 257/310; 257/750
(58) Field of Search ................................ 257/295, 306, 257/310, 750

(56) References Cited

U.S. PATENT DOCUMENTS

| | | | |
|---|---|---|---|
| 4,994,893 A | * | 2/1991 | Ozaki et al. ................ 257/306 |
| 5,045,899 A | * | 9/1991 | Arimoto ...................... 257/306 |
| 5,475,248 A | * | 12/1995 | Takenaka .................... 257/295 |
| 5,629,539 A | * | 5/1997 | Aoki et al. .................. 257/306 |
| 6,060,351 A | | 5/2000 | Parekh et al. |
| 6,204,115 B1 | | 3/2001 | Cho |
| 6,235,603 B1 | | 5/2001 | Melnick et al. |
| 6,255,159 B1 | | 7/2001 | Thakur |
| 6,329,682 B1 | | 12/2001 | Parekh et al. |
| 6,359,295 B2 | * | 3/2002 | Lee et al. ................... 257/295 |
| 2001/0030338 A1 | | 10/2001 | Noble |
| 2002/0020883 A1 | | 2/2002 | Dennison |
| 2002/0064065 A1 | | 5/2002 | Salling |

* cited by examiner

*Primary Examiner*—David Nelms
*Assistant Examiner*—Dao H. Nguyen
(74) *Attorney, Agent, or Firm*—Rose Alyssa Keagy; W. James Brady, III; Frederick J. Telecky, Jr.

(57) ABSTRACT

A capacitor under bitline DRAM memory cell and method for its fabrication provides a high density memory cell with the capacitor formed in the PMD layer. The memory cell utilizes several variations of storage contact pillar structures as, for example, a storage plate of the memory cell capacitor formed within a trench in the PMD layer. This capacitor plate structure is overlaid with a capacitor dielectric layer which is overlaid with another conductive layer, for example, the M1 layer to form the other capacitor plate. An access transistor formed between substrate active regions and a word line, is in electrical communication with a bit line contact, the storage contact capacitor plate, and the word line respectively. The high density memory cell benefits from the simple standard processes common to logic processes, and in one embodiment requiring only one additional masking step.

40 Claims, 19 Drawing Sheets

US 6,710,391 B2

INTEGRATED DRAM PROCESS/ STRUCTURE USING CONTACT PILLARS

TECHNICAL FIELD OF INVENTION

The present invention relates generally to semiconductor memory devices and their manufacture, and more particularly to capacitor under bitline DRAM memory cells and methods for fabricating such structures and cells providing benefits relating to increased circuit density and processing simplicity.

BACKGROUND OF THE INVENTION

Several trends exist presently in the semiconductor device fabrication industry and the electronics industry. Devices are continually getting smaller and requiring less power. A reason for these trends is that more personal devices are being fabricated which are relatively small and portable, thereby relying on a small battery as its primary supply source. For example, cellular phones, personal computing devices, and personal sound systems are devices which are in great demand in the consumer market. In addition to being smaller and more portable, personal devices are requiring more computational power and on-chip memory. In light of all these trends, there is a need in the industry to provide a memory device, which has memory and logic functions integrated onto the same semiconductor chip.

One type of fast data storage device that has been used consistently to address the memory portion of this demand is the high density of the standard DRAM device. High density DRAM devices have been enabled by advances in photolithography and expensive dielectric materials. However, as the cell area decreases, process margins such as alignment tolerance have become limiting factors for developing a simple cost effective high density DRAM memory cell.

Several types of DRAM memory cells are used commonly, a single capacitor memory cell and a dual capacitor memory cell. The 1T1C (one transistor and one capacitor) memory cell type requires less silicon area than the dual capacitor type, but is less immune to noise and process variations. Additionally, the 1T1C cell requires a voltage reference for determining a stored memory state.

The dual capacitor memory cell (referred to as a 2T2C memory cell) requires more silicon area, but stores complementary signals allowing differential sampling of the stored information. The 2T2C memory cell typically is more stable than a 1T1C memory cell. As illustrated in prior art FIG. 1, a 1T1C DRAM cell 105 includes one access transistor 108 and one memory storage capacitor 110. A storage node capacitor plate (storage plate) 112 of the storage capacitor 110 is connected to a source terminal (source node) 114 of the transistor 108. The 1T1C cell 105 is read from, or written into by applying a signal via the word line WL 115 to the gate 116 of the transistor, thereby coupling the storage plate 112 of the capacitor 110 to the drain 117 of the transistor and the bit line BL 118. A ground node (ground plate) 120 of the storage capacitor 110 is connected to a common ground of the memory array. A sense amplifier (not shown) is connected to the bitline 118 and detects the voltage associated with a logic value of either 1 or 0 associated with the charge of the DRAM capacitor 110. In this manner, the memory cell data is retrieved.

A characteristic of a DRAM memory is that a read operation is destructive in some applications. The data in a memory cell is then rewritten back to the memory cell after the read operation is completed. The sense amplifier usually rewrites or restores (onto that cell) the same logical state as the bit just read from the cell. If the applied read voltage was small enough not to destroy this logical state, then the read operation was not destructive. In general, a non-destructive read requires a much larger capacitor than a destructive read and, therefore, requires a larger cell size.

As illustrated, for example, in prior art FIG. 2, a 2T2C memory cell 130 in a memory array couples to a bit line ("bitline") 132 and an inverse of the bit line ("bitline-bar") 134 that is common to many other memory types (for example, static random access memories). Memory cells of a memory block are formed in memory rows and memory columns. The 2T2C DRAM memory cell comprises two transistors 136 and 138 and two capacitors 140 and 142, respectively. The first transistor 136 couples between the bitline 132 and a first capacitor 140, and the second transistor 138 couples between the bitline-bar 134 and the second capacitor 142. The first and second capacitors 140 and 142 have a common ground terminal.

By contrast to the expensive DRAM process, standard logic processes are simple and very cost effective. Thus, simply adding the standard DRAM process to the simpler standard logic process would be too expensive, both in terms of development and production.

Additionally, as memory cell density increases, there is a continuing challenge to maintain sufficiently high storage capacitance despite decreasing cell area. One way of increasing cell capacitance is through three-dimensional cell capacitor structures, such as trenched or stacked capacitors.

Deep trench capacitors have been implemented in prior art DRAM cells below the substrate surface in what is referred to as capacitor under the bit line (CUB) type DRAM cells. Several trench capacitor cells have had process problems, particularly where increases in cell density has pressed the access transistor alongside the trench capacitor. Attempts to use short-channel lengths for the access transistor have run up against the effects of drain-induced barrier lowering. Some of the process problems presented by these prior art approaches include: the epi process from the contact hole being barely controllable; the gate dielectric grown from the gate (rather than the channel) causing a potential reliability problem; alignment tolerances between contact holes; and word lines that are patterned before the contact process. In addition, these approaches have the tendency of decreasing process margins more than conventional processes.

Prior art capacitor over bit line (COB) type DRAM memory cells have also used various configurations of planar, trenched or stacked capacitors in the metal layers and other layers over the bit line. Generally, these implementations resort to processes requiring a number of additional masking, deposition, etching, or other production process steps. These additional process steps have a great impact on manufacturing costs and capitol equipment costs particularly where they are associated with added photolithographic equipment and more complex photo processing. Defect density inevitably increases with each additional photomasking layer and compromises yield and reliability.

Thus, conventional combinations of a standard DRAM process with the simpler standard logic process have been too expensive for the applications considered.

Also, conventional prior art COB type DRAM cells integrated into the standard logic process are generally limited to the relatively thin IMD (inter-metal dielectric) layers, by comparison to some other layers under the bit line such as the PMD (poly-metal dielectric) layer or the substrate. This may not be a problem when planar capacitors are used in the DRAM, consuming large areas of semiconductor but when three-dimensional capacitors are to be integrated into the IMD layers, depth issues become paramount.

Accordingly, there is a need in the industry to provide a simple high density memory device, which has memory and logic functions integrated onto the same semiconductor chip, permits the use of the simpler standard logic process with a minimum of process steps, yet has the high density benefits of the DRAM structure and process formed within the thicker PMD layer.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The invention is directed to a capacitor under bitline type DRAM memory cell and method for its fabrication. In particular, the memory cell provides a high density CUB type DRAM cell with a three-dimensional capacitor formed substantially within the relatively thick PMD layer. The memory cell utilizes several variations of storage contact pillar structures as a first capacitor plate of the memory cell capacitor formed within a trench in the PMD layer. In one aspect of the present invention, a capacitor dielectric layer such as $Ta_2O_5$, $TiO_2$, or BST is deposited over the first capacitor plate (e.g., the storage contact pillar structures). To form the other or second capacitor plate, the capacitor dielectric layer is then covered with another conductive layer, for example, the first metal (M1) layer or another plate material. An access transistor formed between substrate (e.g., semiconductor substrate) active regions and a word line is in electrical communication with a bit line contact, the first capacitor plate, and the word line, respectively. The memory cell effectively integrates (embeds) into the simple standard logic process the high density benefits of the DRAM process, in effect forming an embedded DRAM (eDRAM), without the usual added development and manufacturing cost issues of the more complex standard DRAM process. In one embodiment of the present invention, this integrated eDRAM process requires only one additional masking step.

In one aspect of the present invention the capacitor plate that includes the contact pillars (or contact plugs) can be either the ground plate (reference plate), or the storage plate.

The term "ground" herein, shall be understood in one or more aspects of the present invention to represent any specific, or preset voltage (e.g., reference voltage) which may include a ground voltage. For example, a preset voltage, which may include the ground voltage, may be applied to a ground plate, a ground plane, a ground plate contact structure, or a ground plate region as discussed herein.

In another example, the capacitor plate that includes, for example, the M1 layer, can be either separate from the ground plate, or the ground plate can comprise the M1 layer.

In still another variation of the present invention, the contact pillar structures may have corrugated or fluted shapes, long thin aspect ratio shapes, or they may include multiple or dummy contact pillars to enhance the effective surface area of the capacitor.

According to another aspect of the invention, one of the conductive capacitor plates may comprise a copper layer with a tantalum nitride barrier layer to prevent migration of the copper.

In another aspect of the present invention, the top conductor layer (reference plate) of the eDRAM capacitor provides a structure which can be continuous across adjoining cells.

In yet another aspect of the present invention, one plate of the capacitor may comprise multiple contact pillars. Contact pillars used as a capacitor plate, may be comprised of conductive materials, for example, tungsten, aluminum, or copper with a tantalum nitride migration barrier layer.

In some variations of the present invention, the cells have a portion of the contact pillar structure of the capacitor plate which extends into a region of the PMD that is not removed. This improves structural strength of the cell during processing. Of these variations, the cell with contact pillars in the storage plate has the greatest capacitance density (capacitance per unit foot-print area).

Single-event upsets (SEUs) are random errors in semiconductor memory devices, which can cause a loss of data. SEUs are caused by passage of energetic charged particles through sensitive regions of a chip. Beneficially, the single-event upset cross-section is reduced by having the contact pillar structures extend over field, effectively shielding the active areas of the substrate, thus reducing random errors and the loss of data.

A further object of the present invention is to provide a method for fabricating a capacitor under bit line memory cell within the PMD layer utilizing several self-aligning steps, while performing these steps within the simple standard logic process.

Yet a further object of the present invention is to provide a DRAM cell with a three-dimensional capacitor structure utilizing contact pillar structures embedded within the PMD layer having reduced complexity and thus reduced defect rate, increased ease of manufacture, and reduced manufacturing cost.

A simple memory structure and method utilizing a three-dimensional capacitor formed substantially within the thick PMD layer provides a high density CUB type DRAM memory cell, which has memory and logic functions integrated onto the same semiconductor chip, thereby permitting the use of the simpler standard logic process with a minimum of process steps, yet has the high density benefits of the DRAM process.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
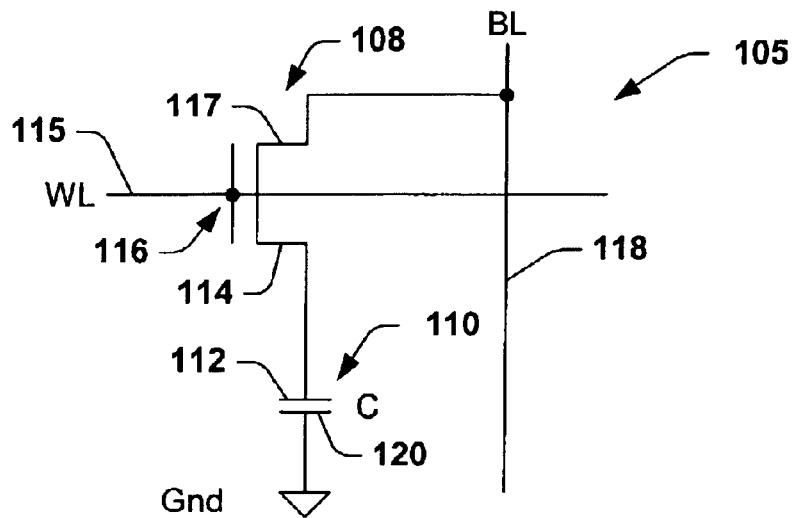
FIG. 1 is a partial schematic diagram illustrating a prior art 1T1C DRAM cell, comprising one transistor and one capacitor.
Figure 2:
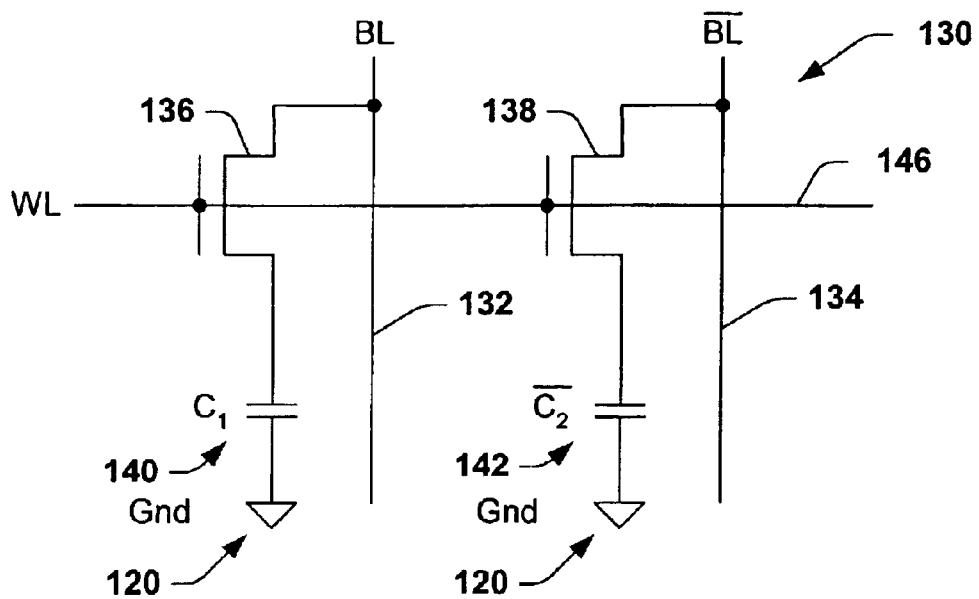
FIG. 2 is a partial schematic diagram illustrating a prior art 2T2C memory cell comprising two transistors and two capacitors.

The present invention will now be described with reference to the drawings, wherein like reference numerals are used to refer to like elements throughout. The invention is directed to an embedded DRAM (eDRAM) memory device utilizing a three dimensional capacitor under the bit line (CUB) memory cell array architecture, which is believed to be applicable to a variety of memory applications. In particular, the device structure provides a system and method of forming a high density DRAM memory cell using simple standard logic type processes. The memory cell of the present invention uses several variations of a contact pillar structure comprising a contact conductive material used as a first capacitor plate formed within a trench within a first insulating layer (e.g., a PMD layer). A capacitor dielectric layer comprising, for example, a capacitor dielectric material such as $Ta_2O_5$, $TiO_2$, or BST then covers the contact pillar structures and the trench to insulate the first capacitor plate from a second capacitor plate deposited in several variations of a second conductive material layer (e.g., an M1 conductive layer, and/or tungsten, aluminum, copper with a tantalum nitride barrier layer, or another capacitor plate material) formed within the walls of the PMD trench itself.

The substrate, polysilicon, and inter-metal dielectric (IMD) layers formed before and after the PMD and M1 layers particular to the present invention and discussed herein may be formed in accordance with standard logic processing practices in the usual manner, but is not so limited.

The access transistor for the DRAM capacitor may be formed as usual between substrate active regions and a word line. The gate of the transistor is in electrical communication with the word line, while the drain and source of the access transistor are in electrical communication with the bit line and the first capacitor plate of the cell capacitor. The role of source and drain for the access transistor may reverse, depending on the voltages applied. For clarity in describing the cell, the bit line node of the cell is hereinafter referred to as the drain node of the access transistor and the storage node is hereinafter referred to as the source node of the access transistor, without regard to the electrical source or drain function.

A contact pillar located at the drain node (hereinafter generally referred to as the drain) of the access transistor, an active region of the substrate, and the bit line is referred to as a bit line contact pillar. A contact pillar located at the source node (storage node) (hereinafter generally referred to as the source) of the access transistor, an active region of the substrate, and a capacitor plate is generally referred to as the storage contact pillar. As such, the capacitor plate associated with the storage contact pillar is herein generally referred to as the storage plate of the capacitor, and the capacitor plate usually associated with a common, or ground terminal of the array, is herein generally referred to as the ground plate of the capacitor. However, it should be appreciated that in one or more aspects of the present invention, contact pillars or variations on the contact pillar structures may be used in the storage plate and/or the ground plate. Thus, the first capacitor plate or second capacitor plate terms may take on the function of a storage plate or a ground plate as described in the specific examples of the present invention.

As with the conductive layers of the capacitor plate materials, the contact pillars may also use the same conductive materials (e.g., tungsten, aluminum, copper with a tantalum nitride barrier layer), or a different conductive material.

The use of the three dimensional capacitor formed within a trench and overlying various contact pillar structures, permits a high density memory cell capacitor relative to the plan view area or foot print. High density memory applications may benefit particularly from the present invention, as the PMD layer is generally thicker (e.g., about 1.0 microns deep) than the prior art DRAM cell capacitors which are implemented in inter-metal layers that are thinner than the PMD layer in standard logic processes. Although the trench may be any depth within the first insulating layer (e.g., the PMD layer), an exemplary implementation utilizes the full PMD depth, to achieve the largest capacitance available.

In accordance with the invention, several implementations of the memory device and their manufacture will now be discussed more fully with references to the accompanying figures. The present invention will be described in the context of the fabrication of an array as that depicted in the top plan layouts indicated for each of the implementations. The subsequent figures, which depict steps of the process at various stages, are cross-sectional views taken at a location generally bisecting a centerline of a typical cell and, where illustrated, a partial cell. The figures are not meant to be actual cross-sectional views of any particular portion of a real DRAM cell (may not be to scale), but are merely convenient tools employed to more fully depict the process aspect of the invention at various stages of manufacture.

Figure 3:
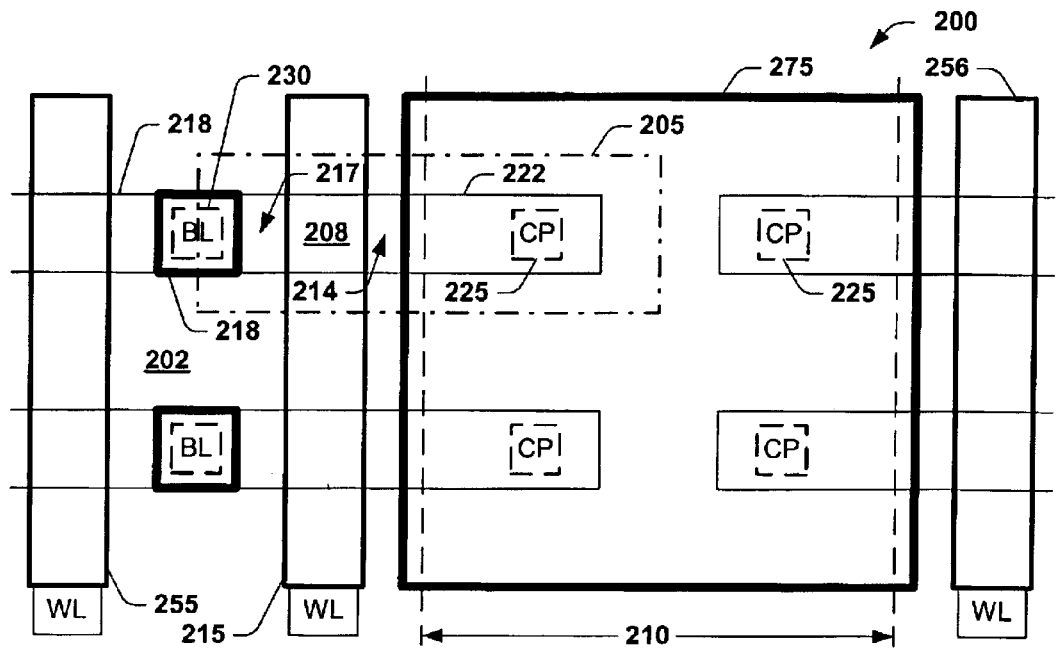
FIG. 3 is a top plan layout illustrating two complete, and two partial exemplary eDRAM memory cell structures, according to a first aspect of the present invention.

FIG. 3, for example, is a top plan layout 200 illustrating two complete, and two partial exemplary eDRAM memory cell structures, according to a first aspect of the present invention, wherein contact pillars are used in the storage plate, and M1 forms the ground plate. The completed eDRAM cell array is fabricated on a substrate 202, typically a silicon semiconductor material. The term "substrate" herein shall be understood in one example to mean one or more semiconductive layers or structures which include active or operable portions of semiconductor devices. An eDRAM cell 205 comprises two basic electrical components; an access transistor 208, and a memory storage capacitor generally formed in a capacitor region 210. These components, their terminals, and structures as described herein, bear a general instructional correspondence to those of the prior art DRAM cell schematic of FIG. 1 as previously discussed, and should not be construed to imply a direct relationship.

The eDRAM cell 205 further comprises a conductive storage plate of the memory storage capacitor formed within the capacitor region 210, and is connected to a first active region of the substrate at the source 214 of the access transistor 208. The domain of the access transistor 208 is generally bounded by a word line WL 215 at the gate of the transistor, the first active region of the substrate at the source 214 of the access transistor 208, and a second active region of the substrate at the drain 217 of the transistor, which is connected to the bit line BL 218. A ground plate within the storage capacitor region 210 is connected to a common ground of the memory array.

A series of substantially parallel, spaced apart, polysilicon word lines 215, traverse the substrate 202, in which have been created a plurality of active areas (active regions) 222 (e.g., 214 and 217), which are insulated from one another, for example, by shallow trench isolation (STI) regions. Each active area 214 of a single memory cell has a storage contact pillar (or storage contact pillar structure) 225, with a storage node contact region where that cell's storage node capacitor plate (storage plate) makes contact to the substrate within the domain of the cell 205. Each cell 205 also has a bit line contact pillar 230, with a single bit line contact region at the active area 217. Each of the substantially parallel, spaced-apart bit lines 218 makes contact with a plurality of bit line contact regions. Eventually, the bit lines and word lines will be connected to periphery contacts (not shown), which are located at the respective ends of the array and are capable of being in electrical communication with peripheral circuitry for controlling memory cell access.

Figure 4:
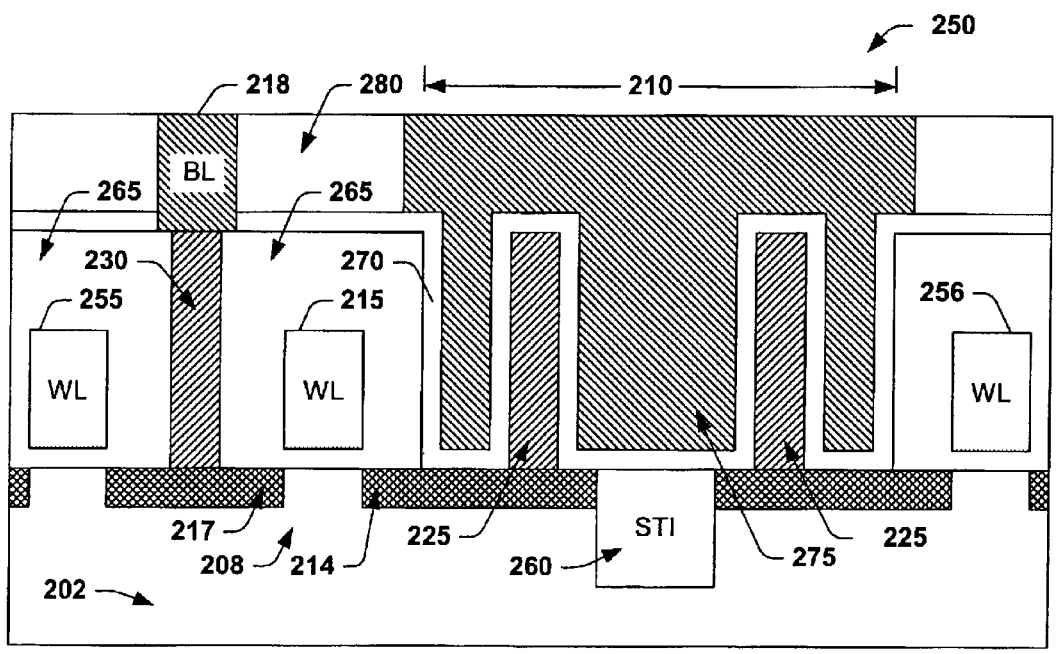
FIG. 4 is a cross-sectional view of the exemplary eDRAM memory cell structures of FIG. 3.

FIG. 4 illustrates a fragmentary cross-sectional view of a semiconductor wafer fragment 250. Wafer fragment 250 is defined in part by a substrate 202, and an array of substantially electrically isolated word lines, such as the illustrated word lines 215, 255 and 256 which may be formed according to standard process practices.

Active regions 222 (see FIG. 3) are provided about the word lines, such as active regions 214 and 217, to define an array of memory cell access transistors 208 as discussed above. A shallow trench isolation (STI) region 260 further insulates the active regions 222 from one another.

In accordance with an aspect of the present invention, a three dimensional capacitor is formed in a trench (or cup) etched, for example, about 0.4 microns deep within a PMD layer 265. The active areas 214 at the bottom of the trench and a storage contact pillar 225 form a storage plate of the capacitor. A thin deposition of $Ta_2O_5$, $TiO_2$, or BST, or another similar capacitor dielectric material, forms the capacitor dielectric material layer 270. The ground plate 275 of the capacitor and the bit line contact 218 is formed by a M1 metal layer deposition of conductive material through openings in the M1 dielectric layer 280, and over the capacitor dielectric layer 270. The ground plate or the storage plate conductive material including the contact pillars used as a capacitor plate, may include a variety of conductive materials, for example, tungsten, aluminum, or copper with a tantalum nitride migration barrier layer.

An exemplary eDRAM cell process will now be described in FIGS. 5–11 as it relates to the first aspect of the present invention and FIGS. 3 and 4, wherein contact pillars are used in the storage plate, and M1 forms the ground plate.

Figure 5:
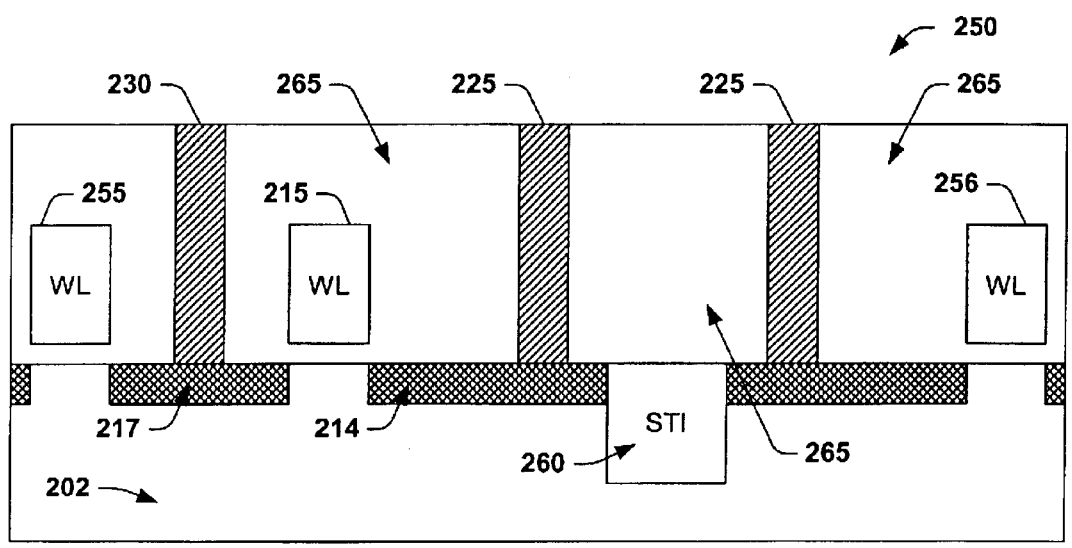
FIGS. 5–11 include cross-sectional views illustrating exemplary steps of a process for fabricating the exemplary eDRAM memory cell structures of FIG. 3.

Referring to FIG. 5, the semiconductor wafer fragment 250 is formed by usual and accepted standard processing up through that shown, wherein the wafer has been processed through the formation of the contacts 225, 230 within the PMD layer 265. For example, FIG. 5 depicts that the active areas 222 (e.g., 214 and 217) have been formed in the substrate 202, for example, via a source/drain diffusion, the STI 260 isolation area is formed to insulate the active areas via a conventional STI process, the word lines (e.g., 215, 255 and 256 are formed as polysilicon gates), and the bitline contact pillar 230 and the storage contact pillars 225 have been formed in the PMD material layer 265. Optionally, the bitline contact pillars and the storage contact pillars are formed in the same process sequence. Alternatively, separate process sequences can be used, for example, to enable the use of different contact pillar material. For example, the bitline contact pillar may be formed of tungsten and the storage contact pillar formed of silicon.

Figure 6:
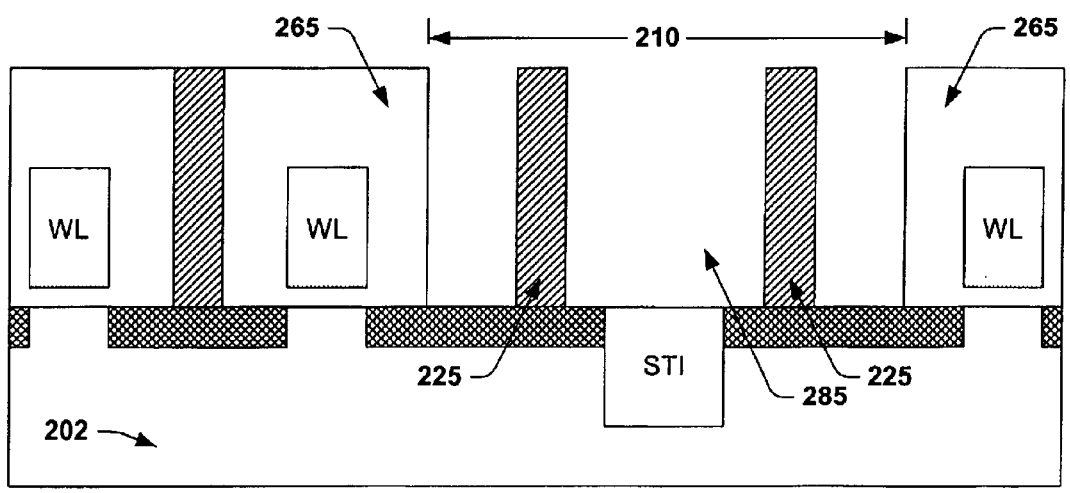

In FIG. 6, the storage capacitor region 210 is formed or defined by etching a trench (cup shaped region) 285 of about 1.0 microns depth into the PMD layer 265, for example, down toward the uppermost surface of the substrate 202. Although FIG. 6 shows the full depth (about 1.0 microns) of the PMD layer 265 etched for the trench 285, an alternate (not shown), is to etch down about 0.4 to 0.5 microns to about the height of the gate (the poly top). The trench 285 leaves the storage contact pillars 225 exposed and freestanding from their contact nodes in the active areas of the substrate 202. According to this exemplary implementation, the storage contact pillars 225 and the active areas 222, will be used as the storage plate of the eDRAM capacitor.

Figure 7:
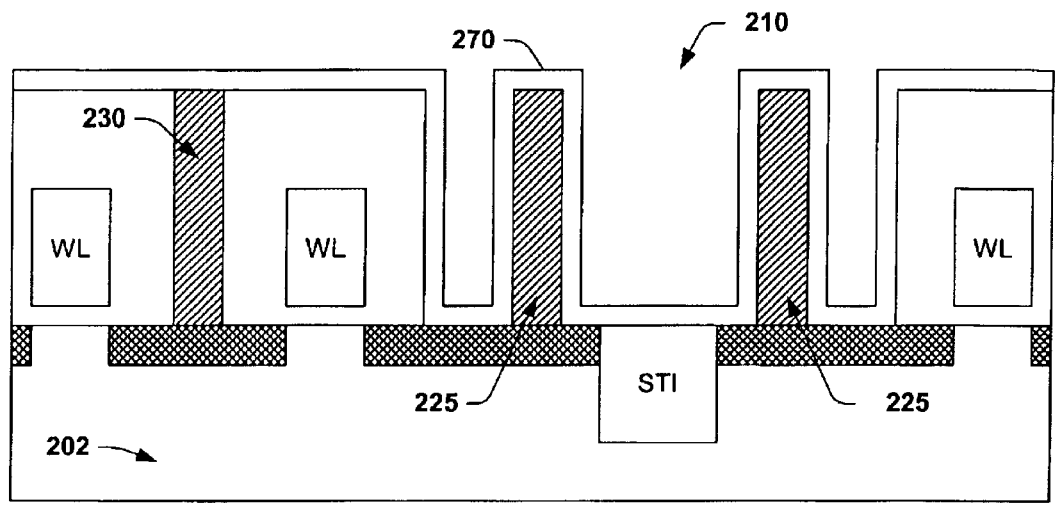

Referring to FIG. 7, a capacitor dielectric layer 270 (e.g., $Ta_2O_5$) is deposited thinly over the wafer, conformally covering the exposed storage contact pillars 225, the entire trench 285 (which is to be used as the capacitor area 210), and the surrounding areas.

Figure 8:
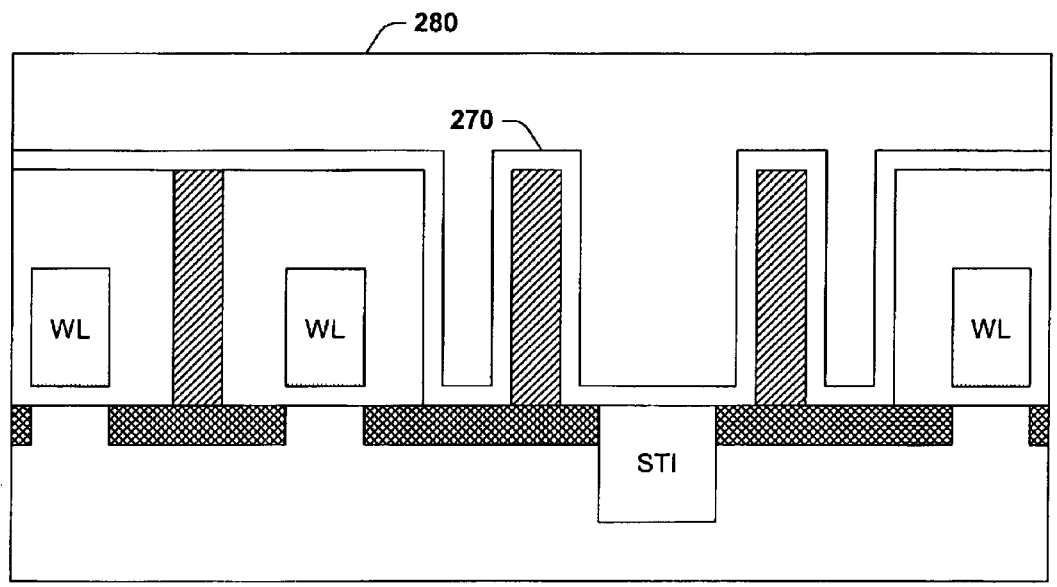

In FIG. 8, the M1 dielectric material layer 280 is deposited over the capacitor dielectric layer 270, and planarized (e.g., by chemical mechanical polishing/planarization (CMP) or another similar process).

Figure 9:
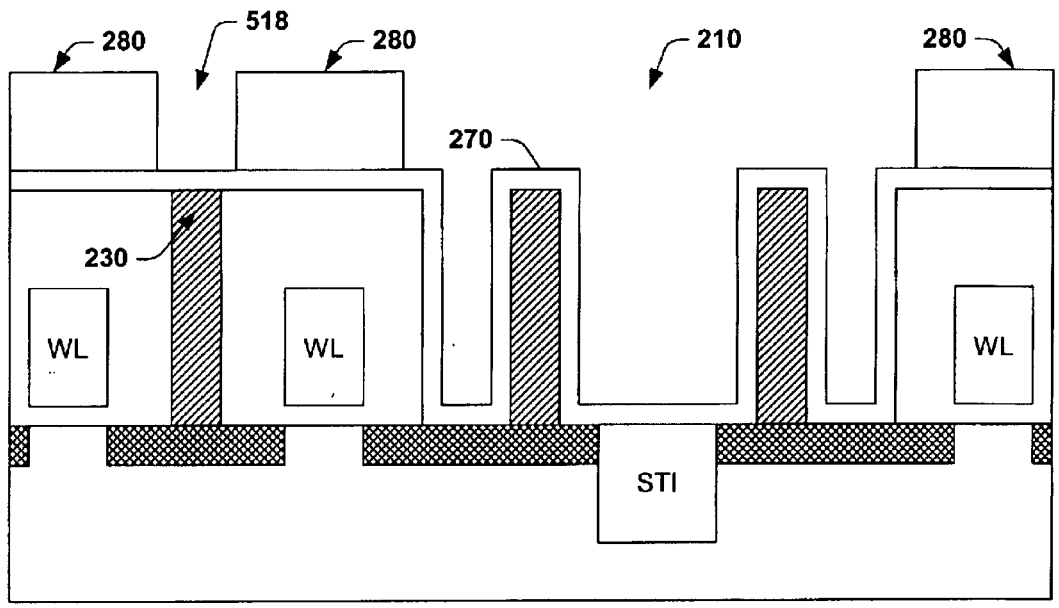

Referring to FIG. 9, the M1 dielectric material layer 280 is patterned and etched down to the capacitor dielectric layer 270, in preparation for the M1 metal layer. In particular, the M1 dielectric material layer 280 is removed in an area 518 over the bit line contact pillar 230, wherein the bit line contact 218 will be formed, and is removed in the capacitor area 210 stopping at the capacitor dielectric layer 270.

Figure 10:
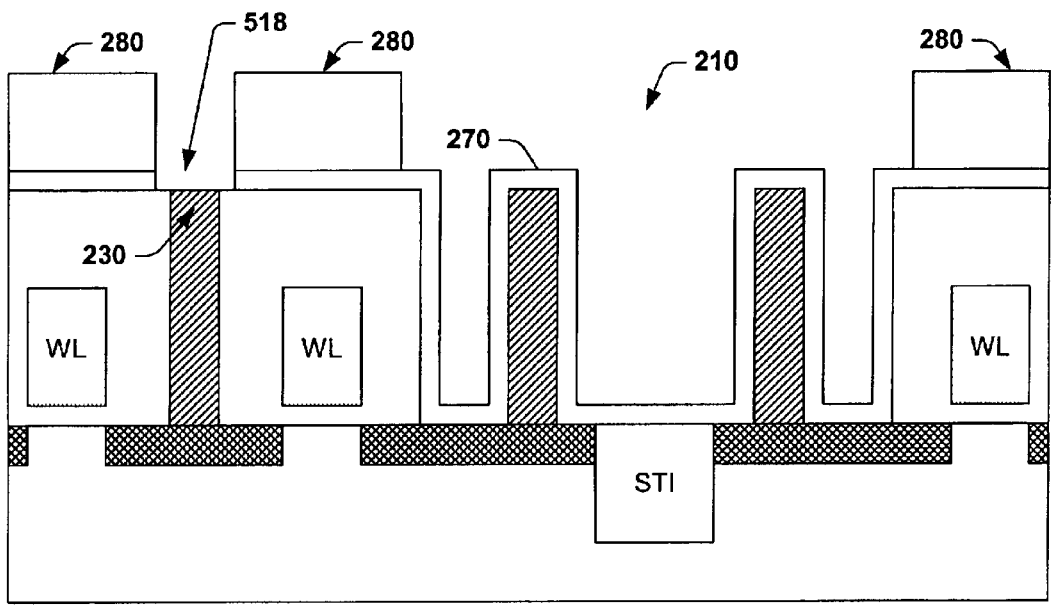

In FIG. 10, the capacitor dielectric layer 270 is selectively patterned and etched to form a hole in the capacitor dielectric layer 270 in the area 518 using a mask (not shown), down to the bit line contact pillar 230, wherein the bit line contact 218 will be formed. Optionally, the patterned etch for the bit line contact can be done at an earlier step.

Figure 11:
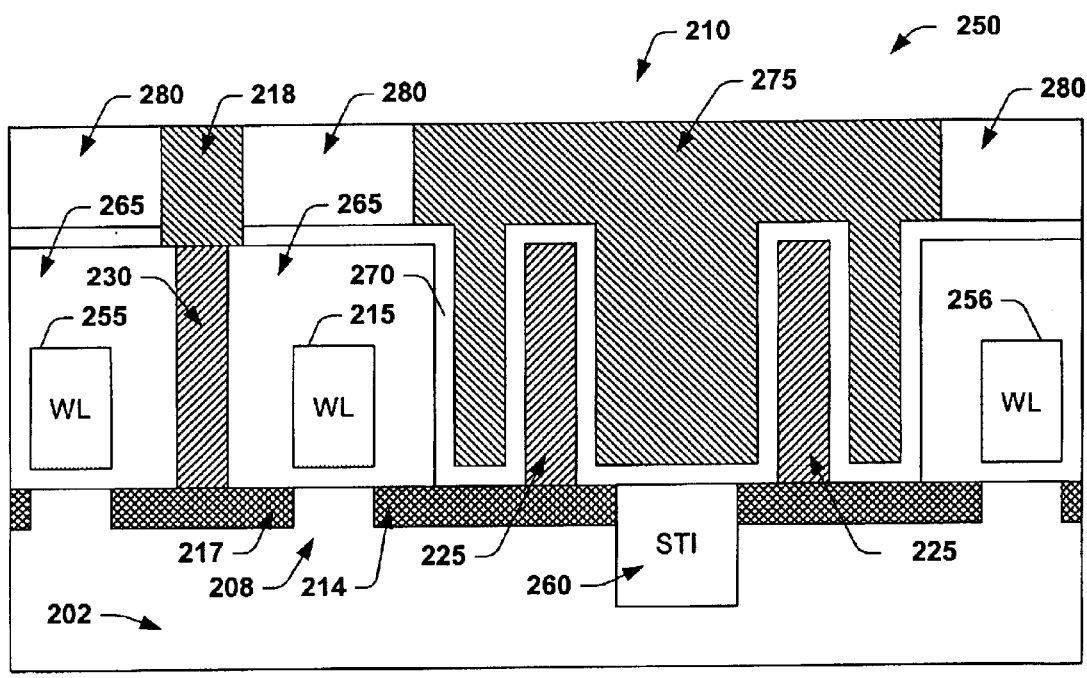

Finally, referring to FIG. 11, the M1 metal layer is deposited over the wafer, and planarized, forming the bit line contact 218 which contacts the bit line contact pillar 230, and fills the capacitor area 210 to define the ground plate 275 of the memory cell capacitor. Thereafter, the semiconductor wafer processing may continue by usual and accepted standard methods.

Thus, a three dimensional CUB capacitor is formed within the PMD layer 265 of a standard logic device for the manufacture of an eDRAM memory cell 205 (see FIG. 3), utilizing contact pillar structures and may be processed using standard logic processes, wherein contact pillars are used in the storage plate, and M1 forms the ground plate.

In the following, a variety of aspects of the present invention will be described, bearing a number of similarities to that of the first aspect described above. As such, similar features and attributes of the device structures may not be fully described for the sake of brevity, yet may apply to the various aspects described herein.

Figure 12:
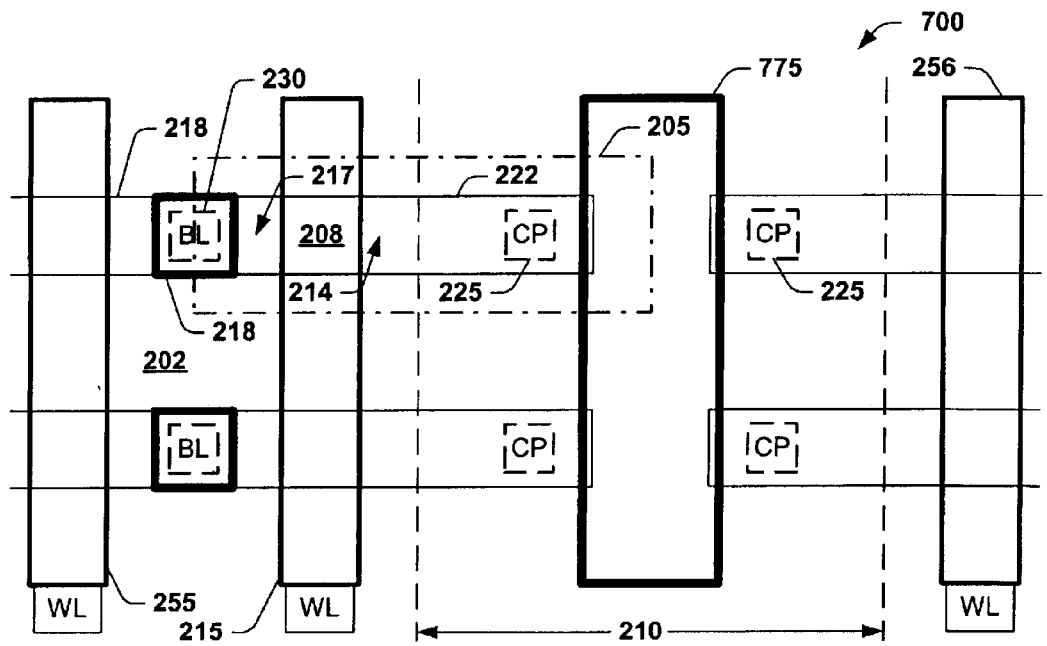
FIG. 12 is a top plan layout illustrating two complete, and two partial exemplary eDRAM memory cell structures, according to a second aspect of the present invention.

FIG. 12, is a top plan layout 700 illustrating two complete, and two partial exemplary eDRAM memory cell structures, according to a second aspect of the present invention, wherein contact pillars are used in the storage plate, and M1 is separate from, but connected to the ground plate. Again, a completed eDRAM cell array is fabricated on a substrate 202, wherein an eDRAM cell 205 of the array comprises an access transistor 208, and a memory storage capacitor generally formed in a capacitor region 210. One difference between the first aspect of the present invention depicted in FIGS. 3–11, and that of the second aspect is an ordering of the processes which form the capacitor ground plate separate from the deposition process of the M1 metal layer in a ground plate contact structure 775. In particular, forming the ground plate separately permits the ground plate to have a separate "plate material" used in a ground plate relative to the material used in the ground plate contact structure 775.

Figure 13:
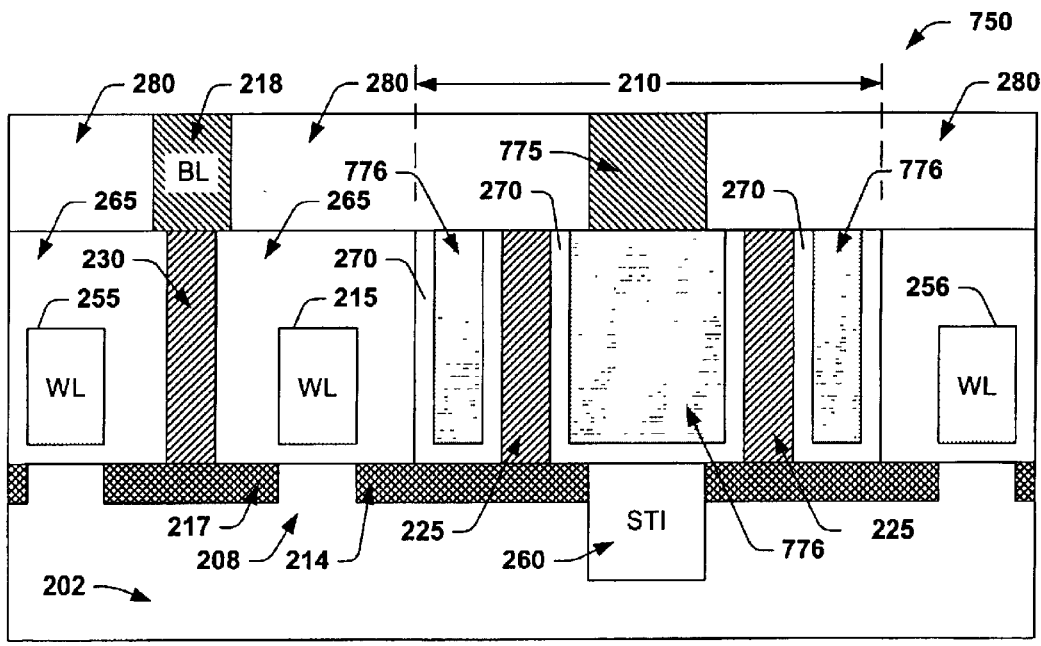
FIG. 13 is a cross-sectional view of the exemplary eDRAM memory cell structures of FIG. 12.

FIG. 13, illustrates a cross-sectional view of a semiconductor wafer fragment 750, and the separate "plate material" used in a ground plate 776 relative to the M1 metal layer material used in the ground plate contact structure 775 and the bit line contact 218.

Again, in accordance with the second aspect of the present invention, a three dimensional capacitor is formed in a trench etched, for example, about 0.4 microns deep within the PMD layer 265. The active areas at the bottom of the trench and a storage contact pillar 225 forms a storage plate of the capacitor. A thin deposition of $Ta_2O_5$, $TiO_2$, or BST, or another similar capacitor dielectric material, forms the capacitor dielectric material layer 270. The ground plate 776 of the capacitor is formed in a "plate material" deposition in a trench formed in the. PMD dielectric layer 265, and over the capacitor dielectric layer 270. The bit line contact 218 is formed along with the ground plate contact structure 775 by the M1 metal layer deposition of conductive material through openings in the M1 dielectric layer 280, and over the capacitor dielectric layer 270.

The basic eDRAM cell process will now be described in FIGS. 14–16 as it relates to the second aspect of the present invention and FIGS. 12 and 13, wherein contact pillars are used in the storage plate, and M1 is separate from, but coupled to the ground plate.

Figure 14:
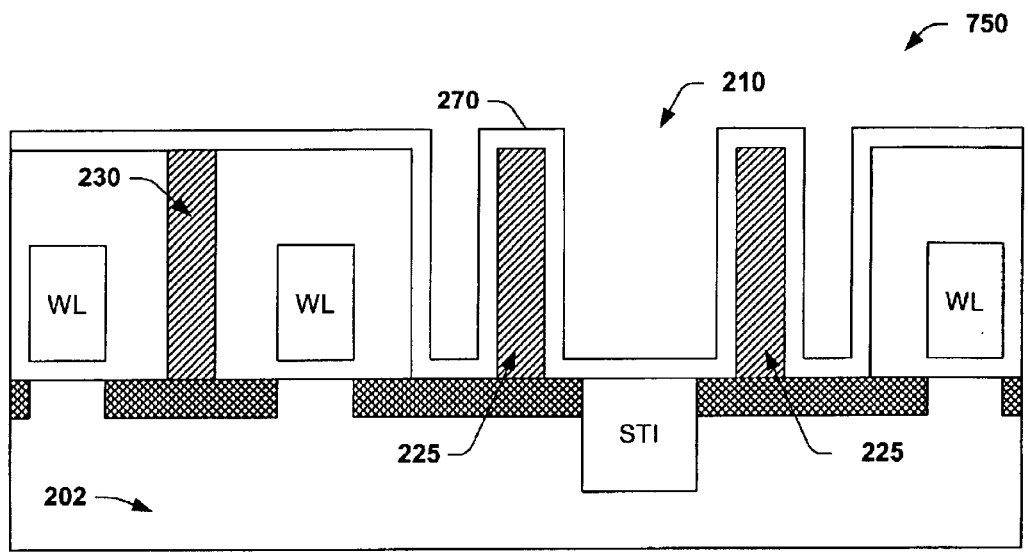
FIGS. 14–16 include cross-sectional views illustrating exemplary steps of a process for fabricating the exemplary eDRAM memory cell structures of FIG. 12.

Prior to FIG. 14, the process proceeds as described for FIGS. 5 and 6, wherein the semiconductor wafer fragment 750 is formed by usual and accepted standard processing up through the formation of the contacts in the PMD material layer 265. Then, the storage capacitor region 210 is formed by etching a trench within the PMD layer 265, down to the substrate 202, which leaves the storage contact pillars 225 exposed and free-standing from the active areas of the substrate 202. Thus, the storage contact pillars 225 and the active areas 222 are ready to be used as the storage plate of the eDRAM capacitor.

Referring to FIG. 14, the process proceeds the same as shown in FIG. 7. A capacitor dielectric layer 270 (e.g., $Ta_2O_5$) is deposited thinly over the wafer, conformally covering the exposed storage contact pillars 225, the entire trench and the surrounding areas. At this point, the process order varies from that of the first aspect, permitting the formation of the ground plate with a different material than the M1 layer material. Optionally, the ground plate can be formed with a multi-layer composite, including the use of a conducting layer followed by an insulation layer to complete the fill of the trench. The conducting layer may comprise a barrier layer along with other layers.

Figure 15:
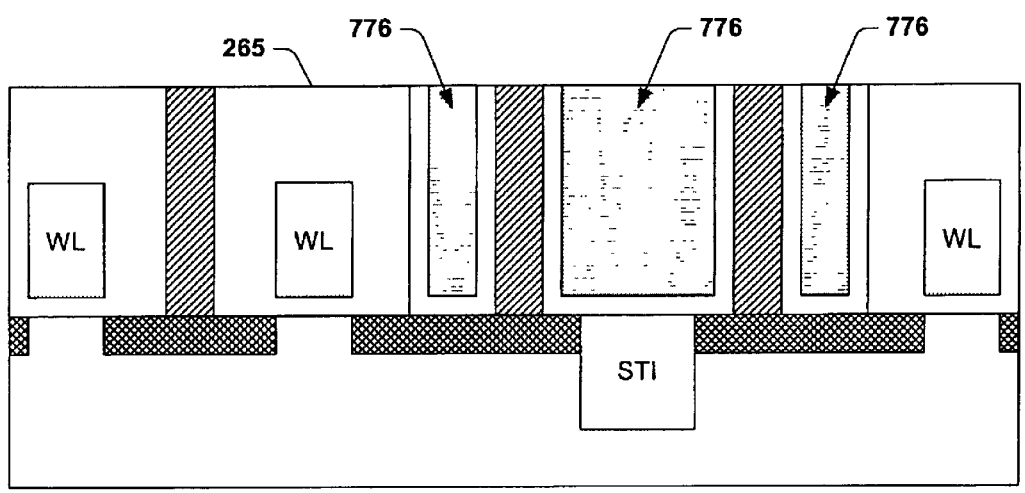

In FIG. 15, a "plate material" (e.g., the conductive materials previously discussed) is deposited over the capacitor dielectric layer 270 (filling the trench formed in the PMD dielectric layer 265), and planarized (e.g., by chemical mechanical planarization (CMP) or another similar process) to define the ground plate 776 of the capacitor. Note in FIG. 15 the CMP in the present example also removes the capacitor dielectric layer 270 on top portions of the PMD 265 and the contacts 225, 230.

Figure 16:
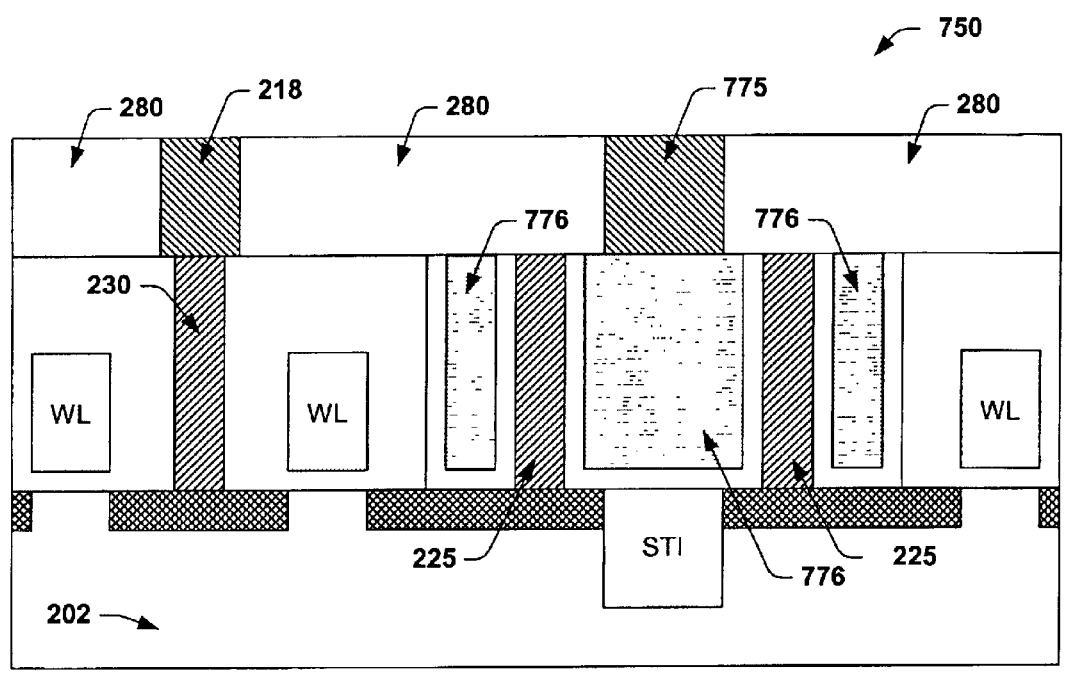

Referring to FIG. 16, the process proceeds similar to that described for FIG. 8, wherein the M1 dielectric material layer 280 is deposited over the entire surface as shown by FIG. 15, and planarized. Then, similar to that which was described for FIGS. 9 and 10, the M1 dielectric material layer 280 is patterned (e.g., etched) to form an opening in the M1 dielectric material in the area over the bit line contact pillar 230 where the bit line contact 218 will be formed, and over the ground plate 776 where the ground plate contact structure 775 will be formed.

Finally, referring still to FIG. 16, the M1 metal layer is deposited over the wafer, and planarized forming the bit line contact 218 which contacts the bit line contact pillar 230, and is deposited over a portion of the ground plate 776 to define the ground plate contact structure 775 of the memory cell capacitor. Thereafter, the semiconductor wafer processing may continue by usual and accepted standard methods.

Thus, a three dimensional CUB capacitor is formed within the PMD layer of a standard logic device for the manufacture of an eDRAM memory cell 205, utilizing contact pillar structures and may be processed using standard logic processes, wherein contact pillars are used in the storage plate, and M1 is separate from the ground plate.

The following third and fourth aspects of the present invention will now be described. Several advantages associated with these aspects are the larger capacitance surface area derived for a given plan area, and greater structural integrity during the processing of the memory structures, as some portions of the plate structures remain outside the etched areas.

Figure 17:
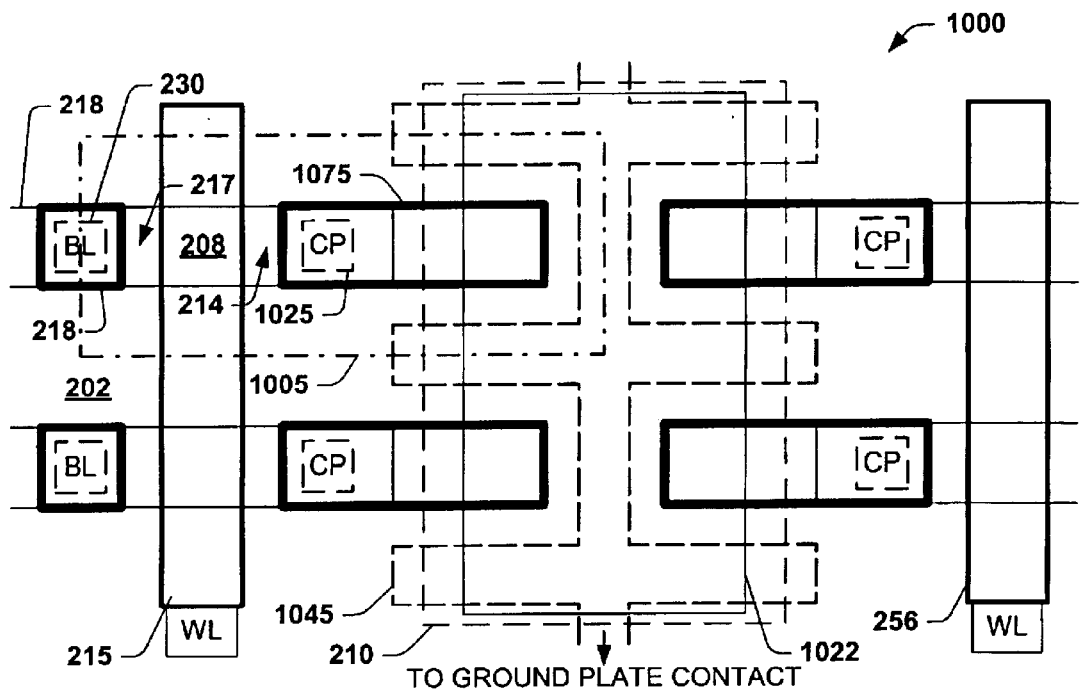
FIG. 17 is a top plan layout illustrating two complete, and two partial exemplary eDRAM memory cell structures, according to a third aspect of the present invention.

FIG. 17, is a top plan layout 1000 illustrating two complete, and two partial exemplary eDRAM memory cell structures, according to a third aspect of the present invention, wherein a modified contact pattern provides a contact pillar in the ground plane and is operable as the ground plate. Again, a completed eDRAM cell array is fabricated on a substrate 202, wherein an eDRAM cell 1005 of the array comprises an access transistor 208, and a memory storage capacitor generally formed in a capacitor region 210. Unlike the first aspect, this third aspect of the present invention does not use the storage node contact pillar 1025 directly as a portion of the storage plate of the capacitor, but rather is used to couple via an M1 contact 1075 to a rectangular storage plate 1076. A large capacitor ground plate 1045, a capacitor dielectric layer 270, and the smaller rectangular storage plate 1076, are formed in a trench within the PMD layer 265. The ground plate 1045 comprises, for example, a modified contact pillar structure as shown, formed generally in the active area 1022 of the ground plane. Eventually, the ground plate 1045, terminates at a ground plate contact (not shown) for external connection.

A conductive plate material is used in the storage plate 1076 in this third aspect, rather than the ground plate as with the second aspect. The contact pillars may also use the plate material, or a variety of other conductive materials including those discussed. Again, the capacitor dielectric layer 270 may also be a variety of insulating materials including those discussed.

Figure 18:
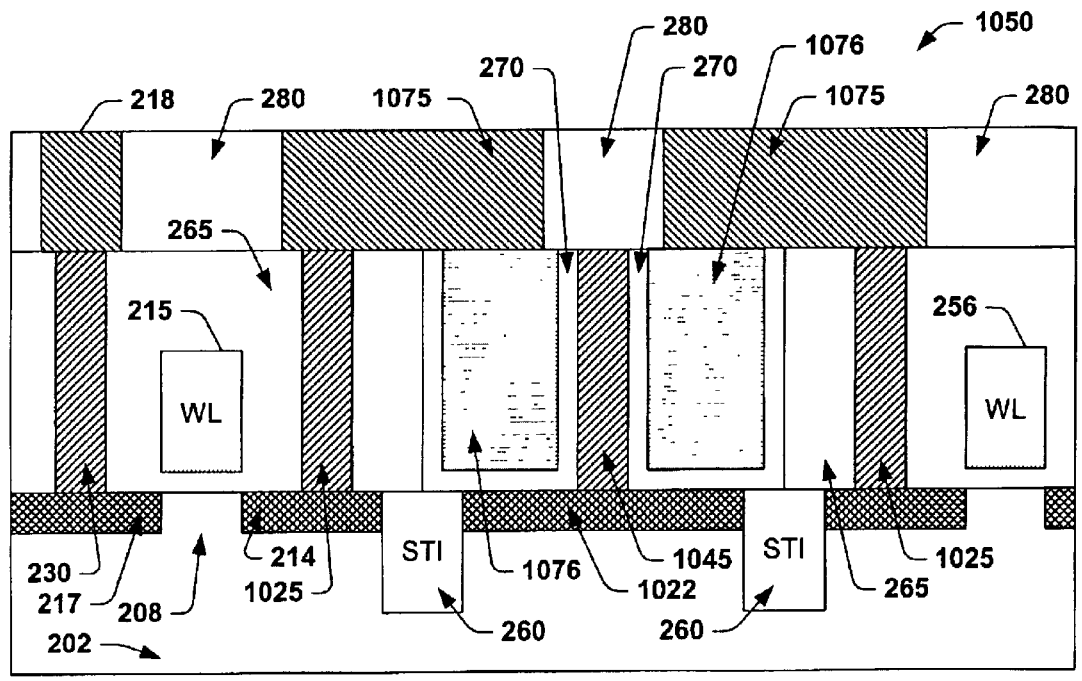
FIG. 18 is a cross-sectional view of the exemplary eDRAM memory cell structures of FIG. 17.

FIG. 18, illustrates a cross-sectional view of a semiconductor wafer fragment 1050, comprising a ground plate contact structure as a capacitor ground plate 1045 formed generally in the active area 1022 of the ground plane, the storage plate 1076 composed of the conductive plate material, and the M1 metal layer providing the bit line contact 218 and the M1 contact 1075 which functions as an electrical connection between the storage contact pillar 1025 and the storage plate 1076.

Again, in accordance with the third aspect of the present invention, a three dimensional capacitor is formed in a trench etched, for example, about 0.4 microns deep within the PMD layer 265. A large capacitor ground plate 1045, a capacitor dielectric layer 270, and the smaller rectangular storage plate 1076, are formed in a trench within the PMD layer 265. The ground plate 1045 of the capacitor is formed as a generally continuous contact structure along an axis of the ground plane, with latterly extending portions anchored into the PMD material. This layout yields structural support and increased capacitor surface area. Two STI regions 260 isolate the ground plate active areas 1022. The bit line contact 218 is formed along with the ground plate contact structure 1045 by the M1 metal layer deposition of conductive material through openings formed in the M1 dielectric layer 280.

Figure 19:
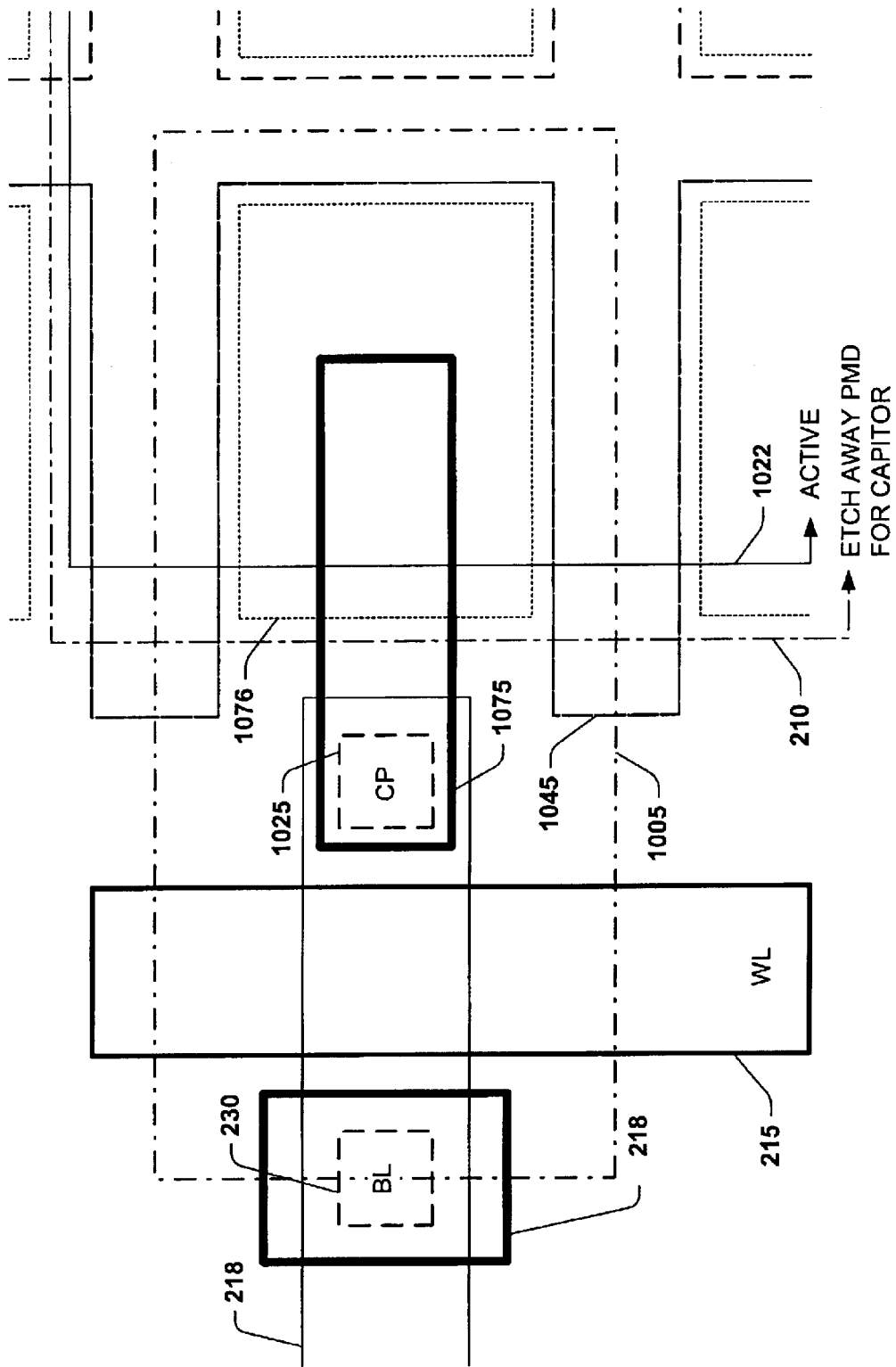
FIG. 19 is a top plan layout illustrating a more detailed view of a single exemplary eDRAM memory cell structure of FIGS. 17 and 18.

FIG. 19 is a top plan layout 1100 illustrating a single exemplary eDRAM memory cell 1005 as shown in FIGS. 17 and 18 in greater detail, according to the third aspect of the present invention, wherein a modified contact pattern provides a contact pillar in the ground plane and is operable as the ground plate. In this view of the eDRAM cell 1005, the rectangular storage plate 1076 is more easily seen, showing its formation within the larger capacitor ground plate 1045 within the capacitor region 210. FIG. 19 also shows that the capacitor region 210 forms one wall of the trench as an etching boundary within the PMD layer 265, while the other three walls of the trench are defined by the surrounding walls of the contact structure forming the ground plate 1045. The STI regions 260 in the substrate below the capacitor and the storage contact pillar 1025 define the active area 1022 of the ground plane.

Thus, a three dimensional CUB capacitor is formed within the PMD layer of a standard logic device for the manufacture of an eDRAM memory cell 205, utilizing contact pillar structures and may be processed using standard logic processes, wherein a modified contact pattern provides a contact pillar in the ground plane and is used as the ground plate.

Figure 20:
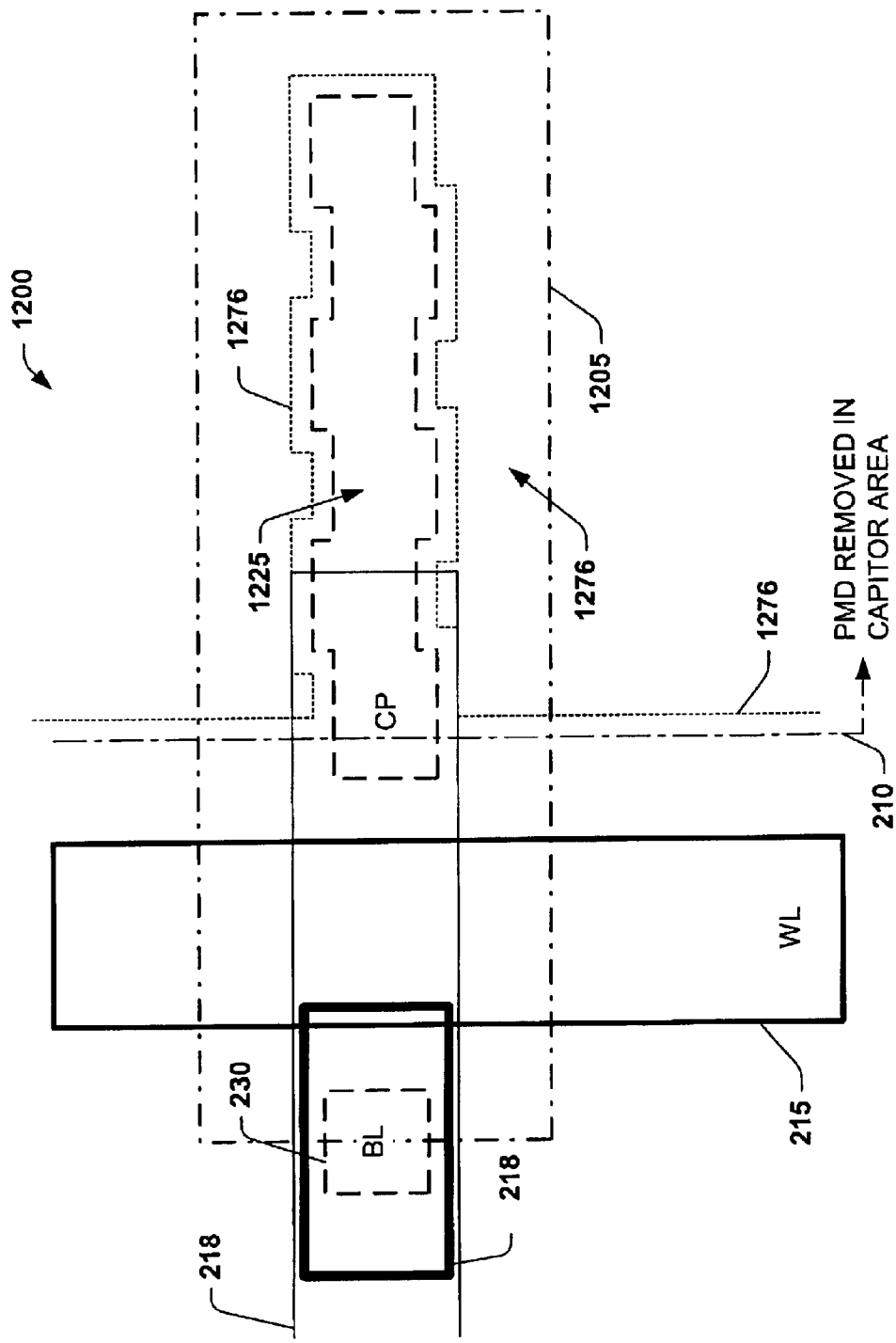
FIG. 20 is a top plan layout illustrating a single exemplary eDRAM memory cell, according to a fourth aspect of the present invention.

FIG. 20 is a refined top plan layout 1200 illustrating a single exemplary eDRAM memory cell 1005, according to a fourth aspect of the present invention, wherein a modified contact pattern provides a contact pillar used in the storage plate connected to the active region. In this view of the eDRAM cell 1005, a modified contact pillar provides a storage plate 1225 with features which produce added surface area for greater capacitance. The storage plate is also connected to the storage node of the active region 214, and is formed within the confines of a larger capacitor ground plate 1276 within the capacitor region 210. FIG. 20 also shows that the capacitor region 210, forms one wall of the trench as an etching boundary within the PMD layer 265, while the other three walls of the trench, are defined by the surrounding walls of the contact structure forming the ground plate 1276. As in the third aspect of the present invention, the left edge of the modified contact pillar remains partially embedded within the PMD for added structural integrity during processing.

Figure 21:
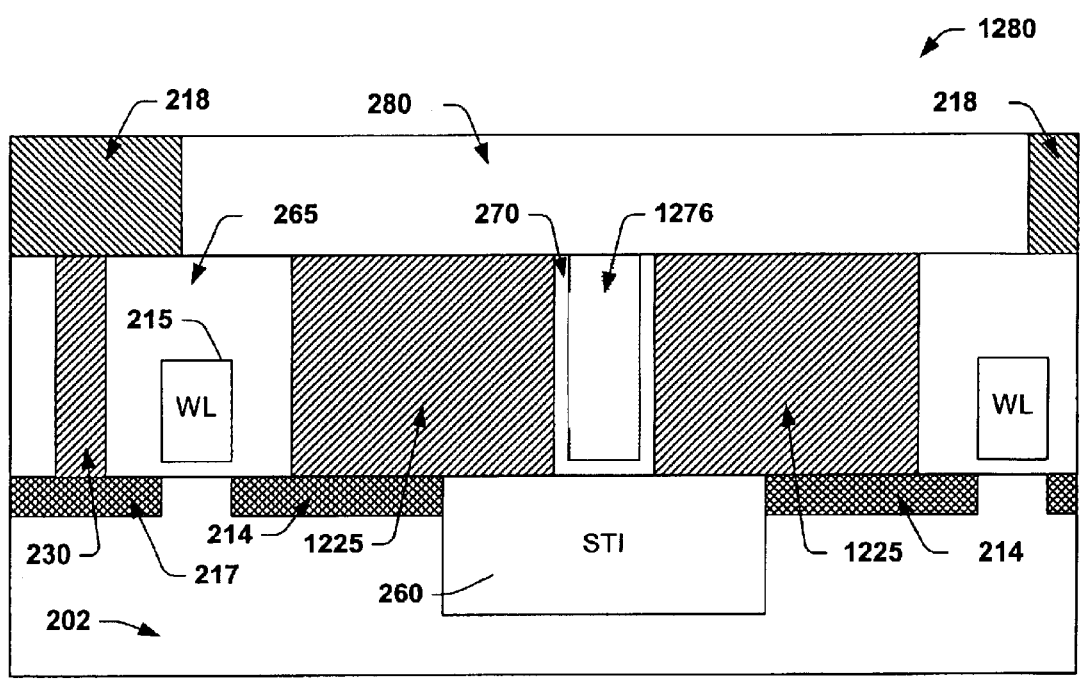
FIG. 21 is a cross-sectional view of the exemplary eDRAM memory cell of FIG. 20.

FIG. 21 illustrates a cross-sectional view of a semiconductor wafer fragment 1280, as depicted by the eDRAM cell 1205 of FIG. 20. The basic cell structure resembles several of the features of the second aspect as illustrated in FIG. 13, and may be processed in a similar manner. By contrast, however, the fourth aspect has greater contact pillar surface area and structural integrity, and does not require a ground plate local contact. "Plate material" is used in the ground plate 1276, while the conductive contact materials may be used in the storage plate contact structure 1225 and the bit line contact pillar 230. Again the M1 metal layer may be used for the bit line contact 218.

Again, in accordance with the fourth aspect of the present invention, a three dimensional capacitor is formed in a trench etched, for example, about 0.4 microns deep within the PMD layer 265. A large capacitor ground plate 1045, a capacitor dielectric layer 270, and the smaller generally rectangular storage plate 1225, are formed in a trench within the PMD layer 265. The ground plate 1276 of the capacitor is formed as a generally continuous structure along an axis of the ground plane, with latterly extending portions anchored into the PMD material. This layout yields structural support and increased capacitor surface area. An STI region 260 isolates the active areas 214. The bit line contact 218 is formed along with the ground plate contact structure (not shown) by the M1 metal layer deposition of conductive material through openings formed in the M1 dielectric layer 280.

Figure 22:
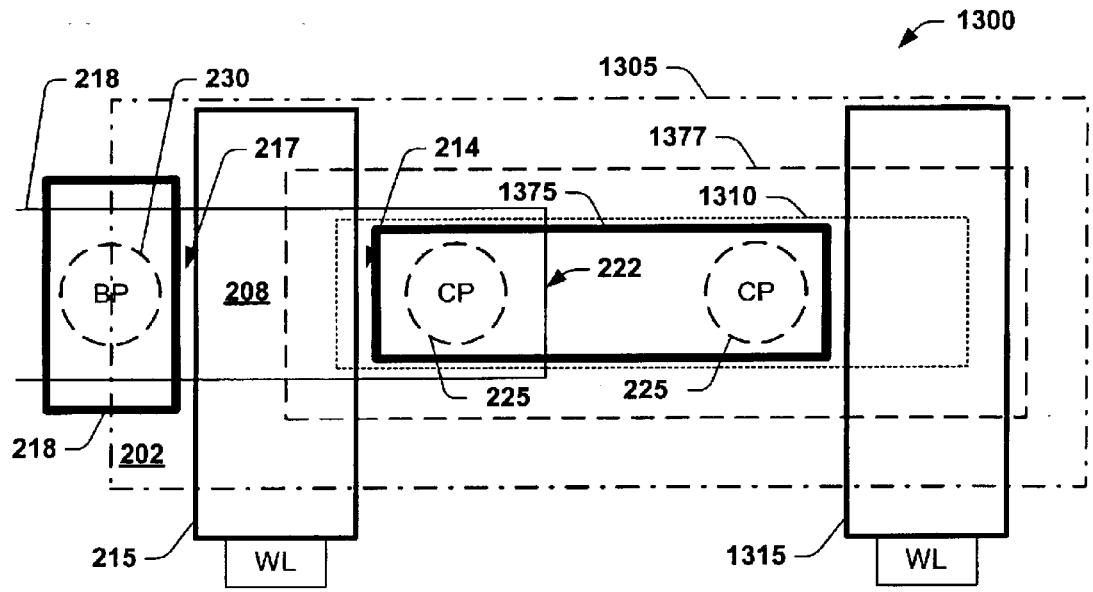
FIG. 22 is a top plan layout illustrating an exemplary eDRAM memory cell structure, according to a fifth aspect of the present invention.

FIG. 22 is a refined top plan layout 1300 illustrating a single exemplary eDRAM memory cell 1305, according to a fifth aspect of the present invention, wherein multiple contact pillars are used in the storage plate, and the capacitor trench optionally extends over the gate. The basic cell structure resembles several of the features of the first aspect as illustrated in FIGS. 3 and 4, and as such, not all elements need be described again. By contrast, however, this fifth aspect may produce greater capacitance surface area with (e.g., a second, or a third) storage pillar, and makes use of additional area over the gate and the STI.

In this view of the eDRAM cell 1305 of FIG. 22, a storage plate comprising two storage contact pillars 225, and the area over the gate 215 and STI 260, produce added surface area for greater capacitance. The extra storage contact pillars over the STI, beneficially reduces the storage node active area that is subject to charge collection that can upset the stored information. The storage plate is also connected to the storage node of the active region 214, and is formed within the capacitor trench 1310. Additional area over the gate (word line) 1315 from an adjacent memory cell (not shown) provides increased capacitance surface area for the memory cell capacitor.

Figure 23:
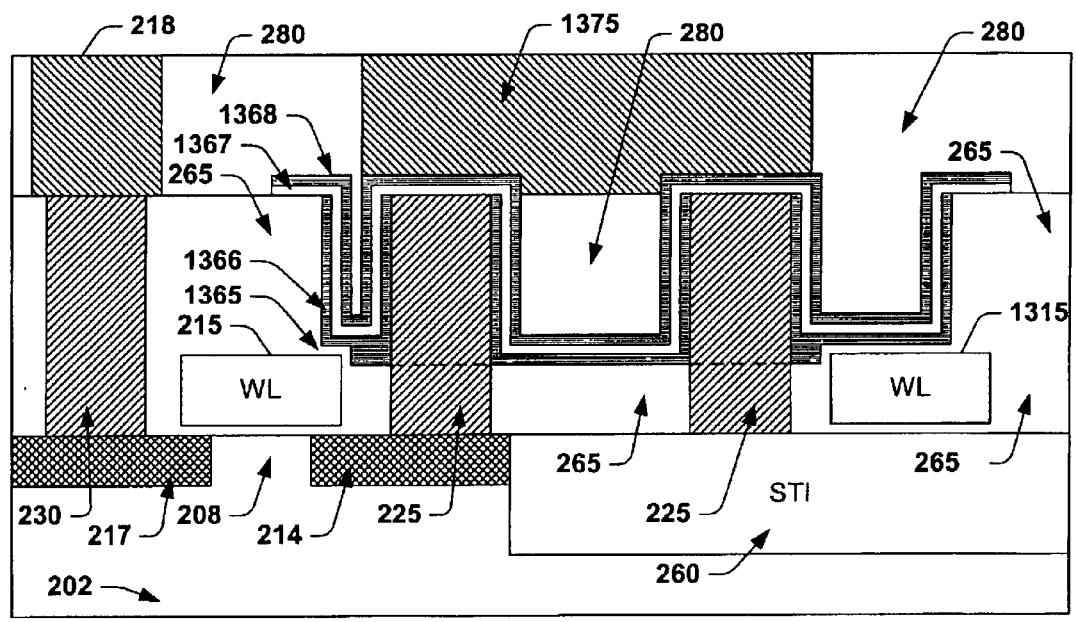
FIG. 23 is a cross-sectional view of the exemplary eDRAM memory cell structure of FIG. 22.

FIG. 23 illustrates a cross-sectional view of a semiconductor wafer fragment 1350, as depicted by the eDRAM cell of FIG. 22. FIG. 23 shows that the capacitor trench 1310, is etched down within the PMD layer 265, toward the gate 215 to an etch stop layer 1365 (e.g., a nitride) which overlays the gate 215 and 1315 and is deposited before the PMD layer 265. Optionally, the depth of the capacitor trench 1310, may approach the substrate 202, for increased surface area, depending on the relative selectivity of the etch stop layer 1365 covering the gate. The walls and floor of the trench provide support for a deposition of the bottom (storage) plate conductive layer 1366, which also covers the storage contact pillars and couples them together. The capacitor stack further comprises a capacitor dielectric layer 1367 (e.g., Ta$_2$O$_5$) overlying the storage plate conductive layer 1366, and then a top (reference) plate conductive layer 1368 overlying the capacitor dielectric layer 1367. Optionally, the bottom and top plate conductive layers (1366 and 1368) may be comprised of the same material.

Optionally, the capacitor stack completely fills the capacitor trench 1310 in the PMD 265, for example, the lower portions of the M1 dielectric layer 280 illustrated within the trench in FIG. 23 are displaced by an increased thickness of the bottom-plate/dielectric top-plate capacitor stack. Optionally, different or the same conductive contact materials may be used in the storage plate contact pillars 225 and the bit line contact pillar 230. Again the M1 metal layer, for example, or another conductive material layer may be used to form the bit line contact 218 and the ground (top, reference) plate contact 1375, by the deposition of the conductive material through openings formed in the M1 dielectric layer 280. The completed eDRAM capacitor stack, according to the fifth aspect of the present invention, may somewhat overlap the trench 1310, to occupy a capacitor boundary 1377 as illustrated in FIGS. 22 and 23.

Again, in accordance with the fifth aspect of the present invention, a three dimensional capacitor is formed in a trench 1310 etched, for example, about 0.4 or 0.5 microns deep within the PMD layer 265 down to an etch stop layer 1365 about the area of the gate 215, or optionally deeper. A larger capacitor surface area is achieved by the use of two storage contact pillars 225, which are further coupled by a bottom (storage) plate conductive layer 1366 deposition over the pillars, the walls and floor of the trench 1310. A capacitor dielectric layer 1367 covers the storage plate. A top (ground, reference) plate 1368 of conductive material is deposited over the capacitor dielectric layer 1367. A ground plate contact 1375 and the bit line contact 218, is deposited through openings formed in an M1 dielectric layer 280 overlaying the PMD layer 265 and capacitor stack. An STI region 260 isolates the active areas 222. The bit line contact 218 may be formed along with the ground plate contact 1375 by the M1 metal layer deposition of conductive material through openings formed in the M1 dielectric layer 280.

In the following, several other aspects of the present invention will each provide a methodology of forming an eDRAM memory cells and the manufacture of such devices illustrated and described herein, as well as with other such devices. While the exemplary methods are illustrated and described herein as a series of acts or events, it will be appreciated that the present invention is not limited by the illustrated ordering of such acts or events, as some acts or events may occur in different orders and/or concurrently with other acts or events apart from that shown and described herein, in accordance with the invention. In addition, not all illustrated acts or events may be required to implement a methodology in accordance with the present invention. Moreover, it will be appreciated that the methods may be implemented in association with the apparatus and systems illustrated and described herein as well as in association with other systems not illustrated.

Figure 24:
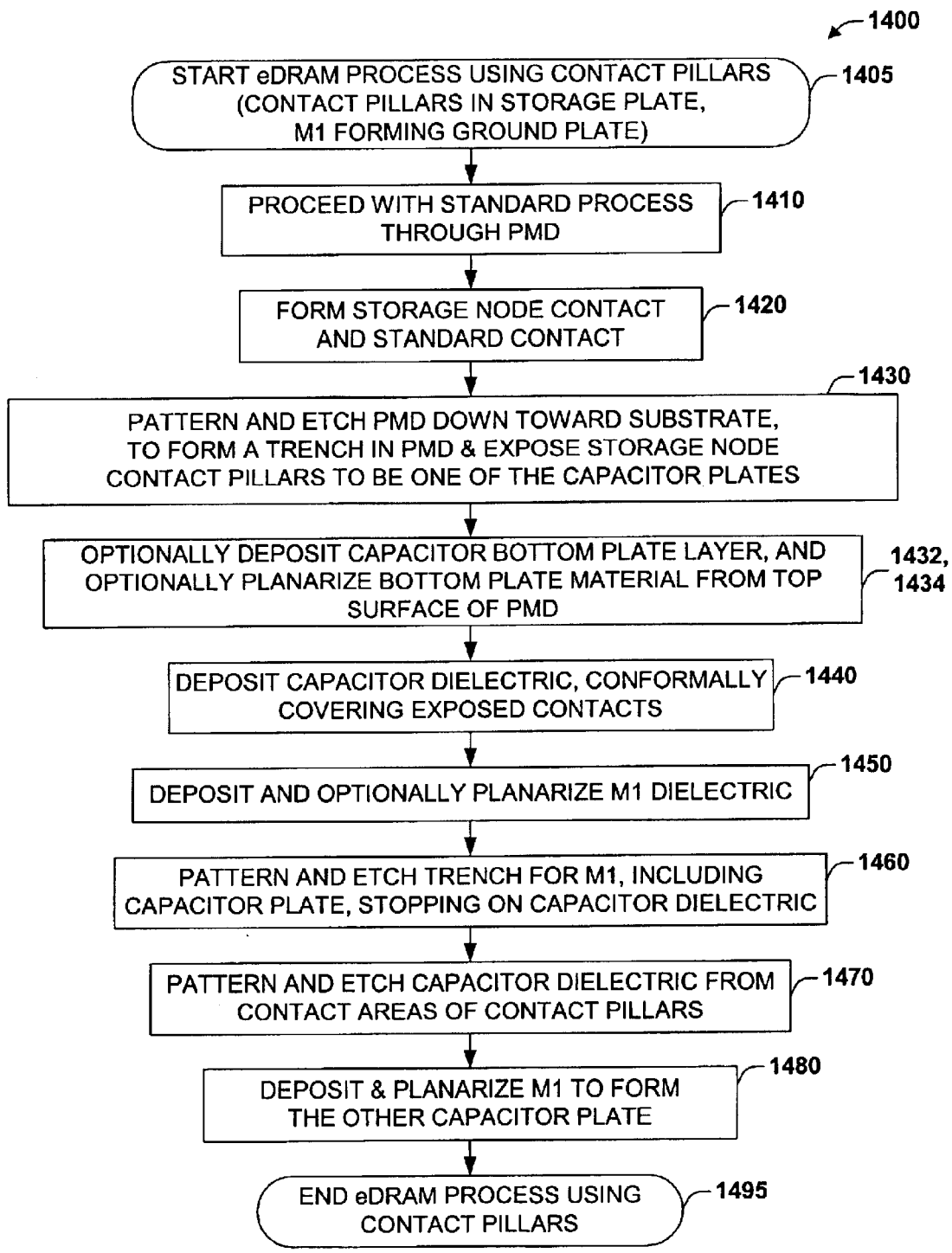
FIG. 24 is a flow diagram illustrating an exemplary method for an eDRAM memory cell fabrication process associated with the structure of FIGS. 3–11 in association with the first aspect of the present invention, wherein contact pillars are used in the storage plate, and M1 forms the ground plate.

FIG. 24, for example, is a flow diagram illustrating an exemplary method 1400 of forming the capacitor under bit line eDRAM memory cell structures of FIGS. 3 and 4, and of the processing illustrated in FIGS. 5–11 in association with the first aspect of the present invention, wherein contact pillars are used in the storage plate, and M1 forms the ground plate.

The method 1400 comprises forming an access transistor in a semiconductor, which has been formed by accepted standard logic process methods, through the formation of the contacts. For example, forming within a first insulating layer (e.g., the PMD layer), an access transistor for the memory cell comprising a source and a drain within a substrate, and having a channel region therebetween, the source, the drain and the channel region each defining an active area of the substrate; and a gate dielectric and a gate electrode overlying the channel region, the gate electrode forming a portion of a word line associated with the DRAM memory cell.

A bit line contact pillar of a contact conductive material is formed within the PMD layer extending through the PMD insulating layer and contacting the drain of the access transistor for electrical connection with a bit line. A storage contact pillar of the contact conductive material is formed within the PMD layer extending through the PMD layer and contacting the source of the access transistor for electrical connection with a memory cell capacitor.

A trench is formed in the PMD layer etching down toward the substrate, for example, to about the uppermost surface of the substrate (e.g., about the depth of the PMD layer), exposing a portion of the storage contact pillar which is operable to be used as one plate (e.g., the storage plate) of the memory cell capacitor. The trench may be any depth within the first insulating layer (e.g., the PMD layer), but in an exemplary implementation, utilizes the full PMD depth to achieve the largest capacitance available. In addition, in an alternate implementation (not shown), the trench is etched down about 0.4 to 0.5 microns to about the height of the gate (the poly top). In another aspect of the present invention, the capacitor trench may overlap the transistor gate if, for example, the gate is covered with an etch stop layer (e.g., a nitride layer) which is deposited before the PMD, or by timing the etching of the capacitor trench to not extend to the gate.

A capacitor dielectric layer (e.g., a thin layer of conformal coating) is deposited over the trench, thereby covering the exposed contact pillar. A second insulating layer (e.g., M1 dielectric material) is deposited over the capacitor dielectric layer and optionally planarized. Portions of the M1 dielectric material layer are removed to expose portions of the capacitor dielectric layer and define a capacitor plate area.

Finally, portions of the capacitor dielectric layer are removed to expose a contact area of the bit line contact pillar; and a conductive material layer (e.g., an M1 conductive layer) is deposited and planarized over the capacitor dielectric layer in the trench capacitor plate area, and the bit line contact pillar, wherein the M1 conductive layer is operable as another plate (e.g., the ground plate) of the memory cell capacitor.

The eDRAM process is illustrated in the method of FIG. 24 according to the top plan of FIG. 3, and the fragment cross section views of FIGS. 4–11. The eDRAM process method begins at 1405. In one exemplary implementation of this method, a semiconductor is provided at 1410, for example wafer fragment 250 of FIG. 5, which has been formed by accepted standard logic process methods, through the formation of the access transistor and the contacts at 1420, for example, bit line contact pillar 230 and storage contact pillar 225 of the contact conductive material, and having word lines 215, 255 and 256 all formed within a PMD layer 265, and over a substrate 202 having active areas 214 and 217, which are separated by STI isolation regions 260. The word lines and active areas define nodes of a memory cell access transistor 208 for accessing a memory cell capacitor which will be embedded in the PMD layer.

At 1430 a trench is formed in the PMD layer 265, as depicted by FIG. 6, etching down toward the substrate, for example, to about the uppermost surface of the substrate 202, forming a trench 285 and a capacitor region 210, and exposing a storage contact pillar 225. The storage contact pillar 225 and the storage node active area 214 are operable to be used as one plate of the memory cell capacitor.

At 1432 a capacitor bottom plate layer may optionally be deposited to cover the pillars 225 in the trench 285. If such a bottom plate layer is formed at 1432, then a planarization of such layer may further optionally be performed at 1434 to remove the material from the top surface of the PMD. If, however, the optional acts 1432, 1434 are not employed, the method 1400 proceeds from act 1430 to 1440.

At 1440, a (e.g., thin) capacitor dielectric layer, for example 270 of FIG. 7, of a capacitor dielectric material is deposited over the trench 285, and thereby covering the exposed contact pillar 225, and the surrounding areas.

At 1450 a layer of M1 dielectric material, for example 280 of FIG. 8, is deposited over the capacitor dielectric layer 270 forming the capacitor dielectric layer. Optionally, the M1 dielectric layer may be planarized. At 1460 portions of the M1 dielectric material layer 280 are removed to expose portions, for example 210 and 518 of FIG. 9, of the capacitor dielectric layer 270 and define a capacitor plate area 210. Optionally, the capacitor dielectric material layer 270 may be deposited after etching the M1 dielectric material layer 280. Then, the capacitor dielectric over the bitline (and logic) contact pillars may be patterned and removed, for example, everywhere but the capacitor trench region.

Portions, for example 518 of FIG. 10, of the capacitor dielectric layer 270 are removed at 1470 to expose a contact area of the bit line contact pillar 230.

Finally, at 1480 a layer of the M1 conductive material layer, for example 275 and 218 of FIG. 11, is deposited and planarized over the capacitor dielectric layer 270 in the trench capacitor plate area 210, and the bit line contact pillar 230, wherein the M1 conductive layer 275 is operable as another plate of the memory cell capacitor. Thereafter the eDRAM process method ends at 1495, whereupon standard back end logic processes may continue, and the method 1400 may be repeated for the formation of subsequent memory cell structures, wherein contact pillars are used in the storage plate, and M1 forms the ground plate.

Figure 25:
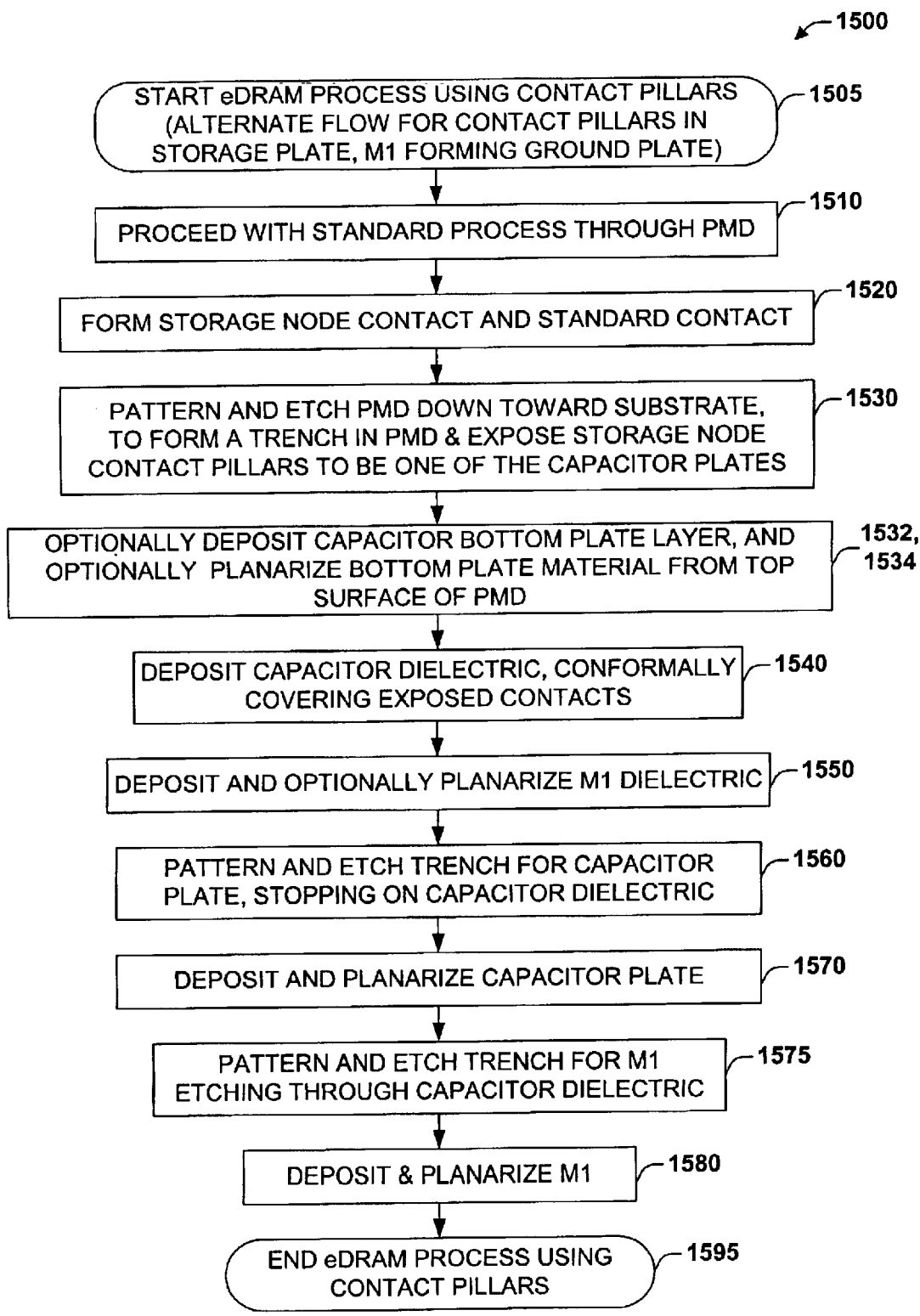
FIG. 25 is a flow diagram illustrating another exemplary method for the eDRAM memory cell fabrication process associated with the structure of FIGS. 3–11 in association with the first aspect of the present invention, wherein contact pillars are used in the storage plate, and M1 forms the ground plate.

FIG. 25 is another exemplary flow chart 1500 illustrating an alternate method of forming the capacitor under bit line eDRAM memory cell structures of FIGS. 3 and 4, and of the processing illustrated in FIGS. 5–11 in association with the first aspect of the present invention, wherein contact pillars are used in the storage plate, and M1 forms the ground plate. The eDRAM process method begins at 1505, and proceeds with 1510 through 1550 similar to method 1400 of FIG. 24, 1410 through 1450, wherein a layer of M1 dielectric material is deposited, as depicted, for example, by FIG. 8, and as such need not be described again.

At 1560 portions of the M1 dielectric material layer 280 are removed to expose portions of the capacitor dielectric layer 270 and define a capacitor plate area 210. At 1570 a layer of conductive capacitor plate material is deposited over the capacitor dielectric layer 270 in the trench capacitor plate area 210, and planarized. Portions of the capacitor dielectric layer are removed at 1575 to expose a contact area of the bit line contact pillar 230 and portions of the trench for the M1 conductive material layer 275.

Finally, at 1580 a layer of M1 conductive material, for example 275 and 218 of FIG. 11, is deposited and planarized over the capacitor dielectric layer 270 in the trench capacitor plate area 210, and the bit line contact pillar 230, wherein the M1 conductive layer 275 is operable as another plate of the memory cell capacitor. Thereafter the eDRAM process method ends at 1595, whereupon standard back end logic processes may continue, and the method 1500 may be repeated for the formation of subsequent memory cell structures, wherein contact pillars are used in the storage plate, and M1 forms the ground plate.

Optionally, the forming of the trench at 1530 may be skipped, and the depositing of the capacitor dielectric layer 270 of 1540 is done after 1560, wherein portions of the M1 dielectric material layer 280 are removed to expose portions of the contact pillars 225 and define a capacitor plate area 210. Thereafter the planarization of 1570 removes the capacitor dielectric layer 270 on the surface, and the M1 etch of 1575 does not have to etch different dielectrics.

Figure 26:
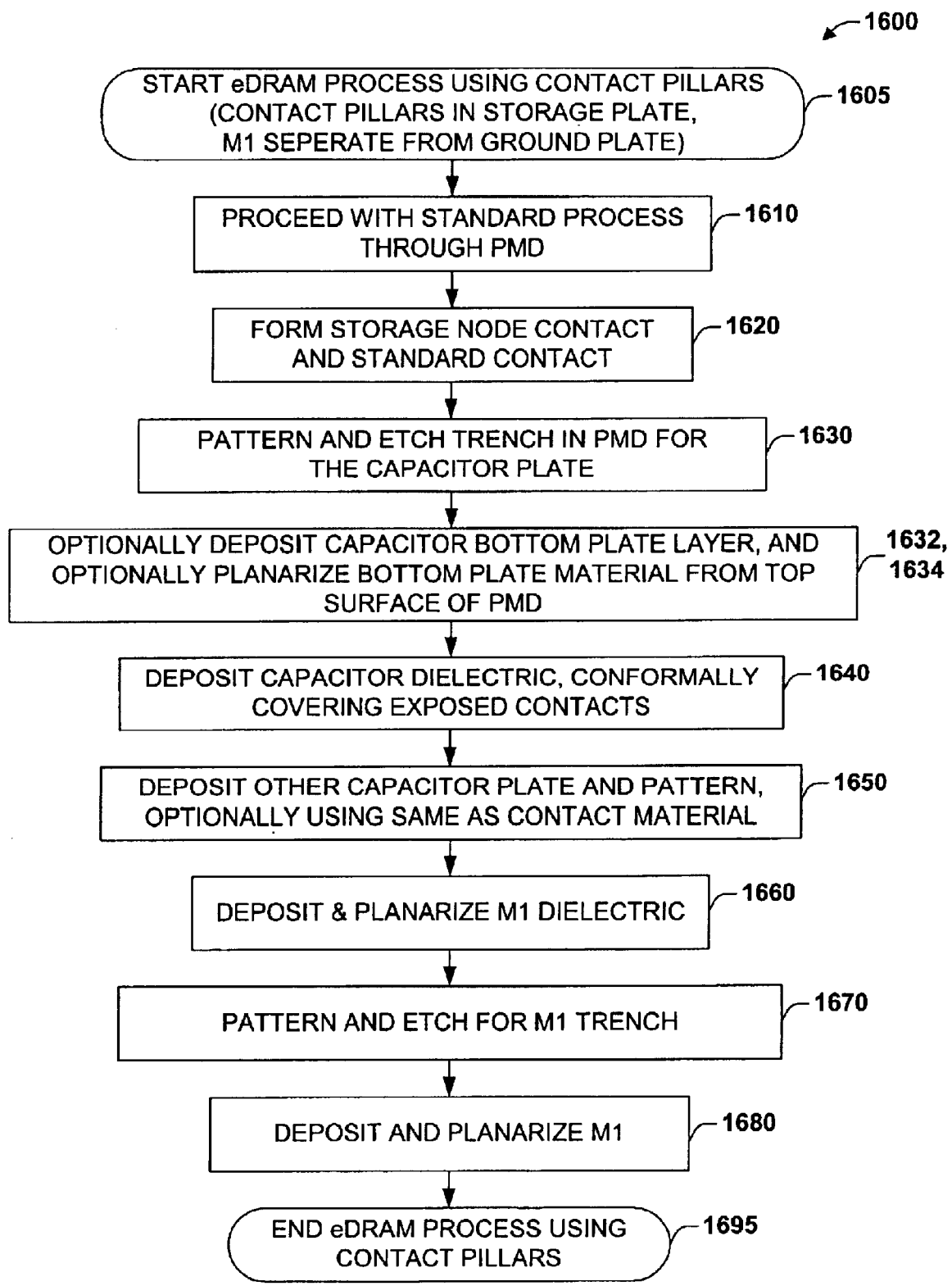
FIG. 26 is a flow diagram illustrating an exemplary method for an eDRAM memory cell fabrication process associated with the structure of FIGS. 12–16 in association with the second aspect of the present invention, wherein contact pillars are used in the storage plate, and M1 is formed separate from the ground plate.

FIG. 26 is still another exemplary flow chart 1600 illustrating a method of forming the capacitor under bit line eDRAM memory cell structures of FIGS. 12 and 13, and of the processing illustrated in FIGS. 14–16 in association with the second aspect of the present invention, wherein contact pillars are used in the storage plate, and M1 is separate from the ground plate. The eDRAM process method begins at 1605, and proceeds with 1610 through 1634 similar to method 1400 of FIG. 24, 1410 through 1434, wherein a trench is formed in the PMD layer 265, as depicted, for example, by FIG. 6, and as such need not be described again. Thus, a capacitor plate is formed at this point, operable as a storage plate of the memory cell capacitor comprising, for example, portions of the storage contact pillar 225, and the storage node active area 214.

At 1640, a (e.g., thin) capacitor dielectric layer, for example 270 of FIG. 14, of a capacitor dielectric material is deposited over the exposed contact pillar 225, the trench capacitor plate area 210, and the surrounding areas.

At 1650 a layer of conductive plate material, for example 776 of FIG. 15, is deposited over the capacitor dielectric layer 270, and planarized down to about the uppermost surface of the PMD layer 265. Optionally, the conductive plate material may be any of the conductive materials previously discussed, including the same material used in the contact pillars 230 and 225. Thus, the conductive plate material 776, forms a capacitor plate operable as a ground plate of the memory cell capacitor.

At 1660 a layer of M1 dielectric material, for example 280 of FIG. 16, is deposited and planarized over the wafer.

At 1670 portions of the M1 dielectric material layer 280 are removed to form holes in the dielectric, exposing contact areas at the bit line contact pillar 230 and the ground plate 776 for later filling with conductive material, for example, the M1 metal layer material at contact locations 218 and 775 of FIG. 16.

Finally, at 1680 a layer of M1 conductive material, for example 275 and 218 of FIG. 16, is deposited and planarized to form contacts at 218 and 775 of FIG. 16 to the bit line contact pillar 230, and the ground plate 776.

Thereafter the eDRAM process method ends at 1695, whereupon standard back end logic processes may continue, and the method 1600 may be repeated for the formation of subsequent memory cell structures, wherein contact pillars are used in the storage plate, and M1 is separate from the ground plate.

Figure 27:
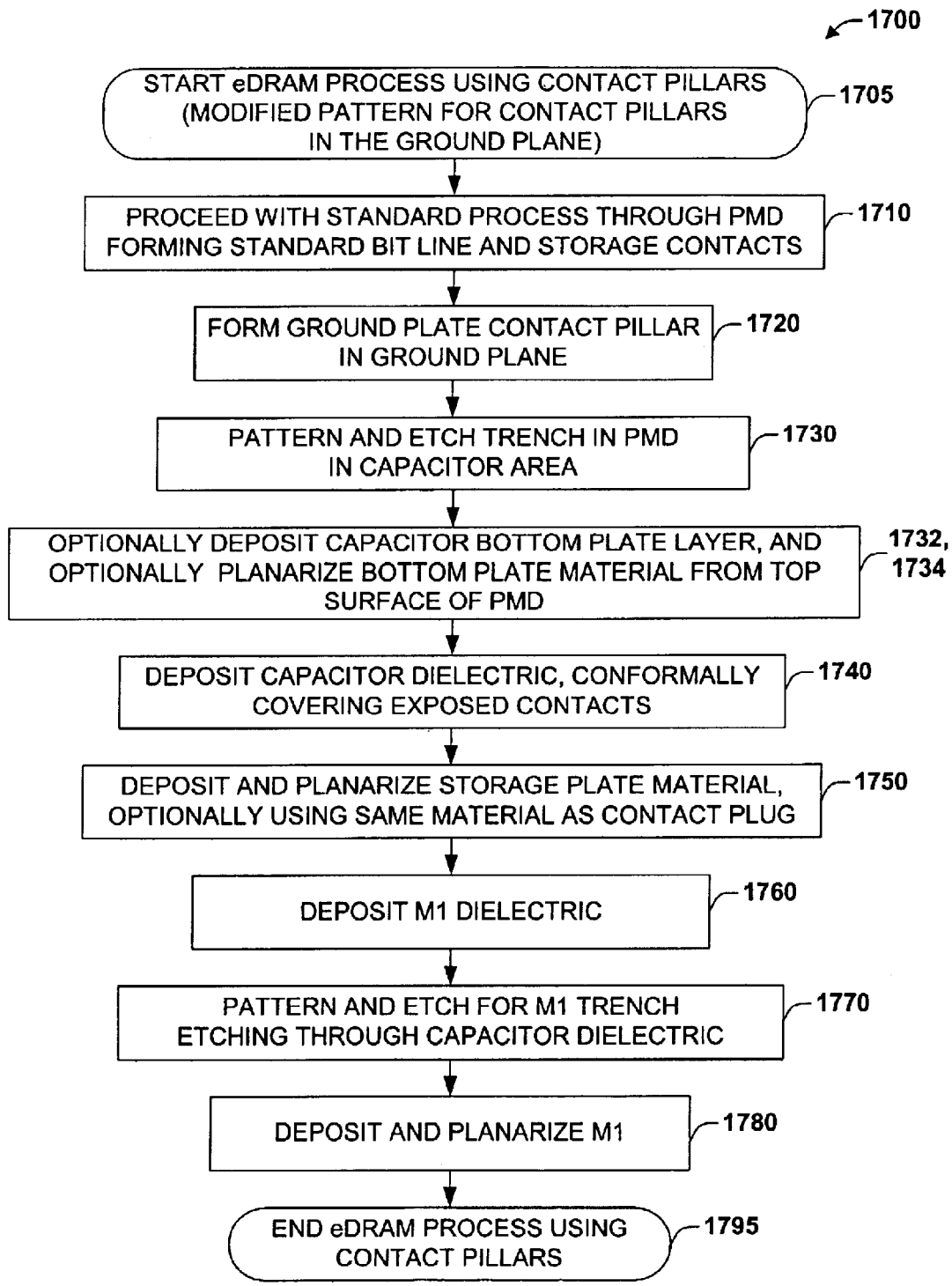
FIG. 27 is a flow diagram illustrating an exemplary method for an eDRAM memory cell fabrication process associated with the structure of FIGS. 17–19 in association with the third aspect of the present invention, wherein contact pillars are used in the ground plate.

FIG. 27 is yet another exemplary flow chart 1700 illustrating a method of forming the capacitor under bit line eDRAM memory cell structures of FIGS. 17–19, in association with the third aspect of the present invention, wherein a modified contact pattern provides a contact pillar in the ground plane and is operable as the ground plate. The eDRAM process method begins at 1705.

In one exemplary implementation of this method, a semiconductor is provided at 1710, for example wafer fragment 1050 of FIG. 18, which has been formed by accepted standard logic process methods and as described previously. The method continues with the formation of contact pillars, for example, a bit line contact pillar 230 and storage contact pillar 1025 of conductive material, and having word lines 215, 255 and 256 all formed within a PMD layer 265, and over a substrate 202 having active areas 217 and 214, which are separated by STI isolation regions 260. The word line and active areas define nodes of a memory cell access transistor 208 for accessing a memory cell capacitor which will be embedded in the PMD layer.

In addition, at 1720 the formation of contact pillars continues with a ground plate contact pillar 1045 of conductive material in contact with an active area 1022 in the ground plane. Thus, the ground plate contact pillar 1045 and the active area 1022 form one plate operable as a ground plate of the memory cell capacitor.

At 1730 a trench is formed in the PMD layer 265, etching down toward the substrate, for example, to about the uppermost surface of the substrate 202, forming a trench capacitor region 210, and exposing the ground plate contact pillar 1045. At 1732 a capacitor bottom plate layer may optionally be deposited to cover the pillar 1045 in the trench. If such a bottom plate layer is formed at 1732, then a planarization of such layer may further optionally be performed at 1734 to remove the material from the top surface of the PMD. If, however, the acts 1732, 1734 are not employed, the method 1700 proceeds from act 1730 to 1740.

At 1740, a (e.g., thin) capacitor dielectric layer 270, of a capacitor dielectric material is deposited over the exposed ground plate contact pillar 1045, the trench capacitor plate area 210, and the surrounding areas.

At 1750 a layer of conductive plate material 1076, is deposited over the capacitor dielectric layer 270 and filling the trench capacitor region 210. 1750 continues with planarization down to about the uppermost surface of the PMD layer 265 to define and separate the storage and ground plates of the memory cell capacitor. Optionally, the conductive plate material may be any of the conductive materials previously discussed, including the same material used in the contact pillars 230, 1025 and 1045. Thus, the conductive plate material 1076, forms another capacitor plate operable as a storage plate of the memory cell capacitor.

At 1760 a layer of M1 dielectric material 280 is deposited and planarized over the wafer. At 1770 portions of the M1 dielectric material layer 280 are removed to form holes in the dielectric, exposing contact areas at the bit line contact pillar 230, the storage contact pillar 1025 and the storage plate 1076 for later filling with conductive material, for example, the M1 metal layer material.

Finally, at 1780 a layer of M1 conductive material is deposited and planarized to form contacts at 218, 1025 and 1075 to the bit line contact pillar 230, the storage contact pillar 1025 and the storage plate 1076. Thereafter the eDRAM process method ends at 1795, whereupon standard back end logic processes may continue, and the method 1700 may be repeated for the formation of subsequent memory cell structures, wherein a modified contact pattern provides a contact pillar in the ground plane and is operable as the ground plate.

Figure 28:
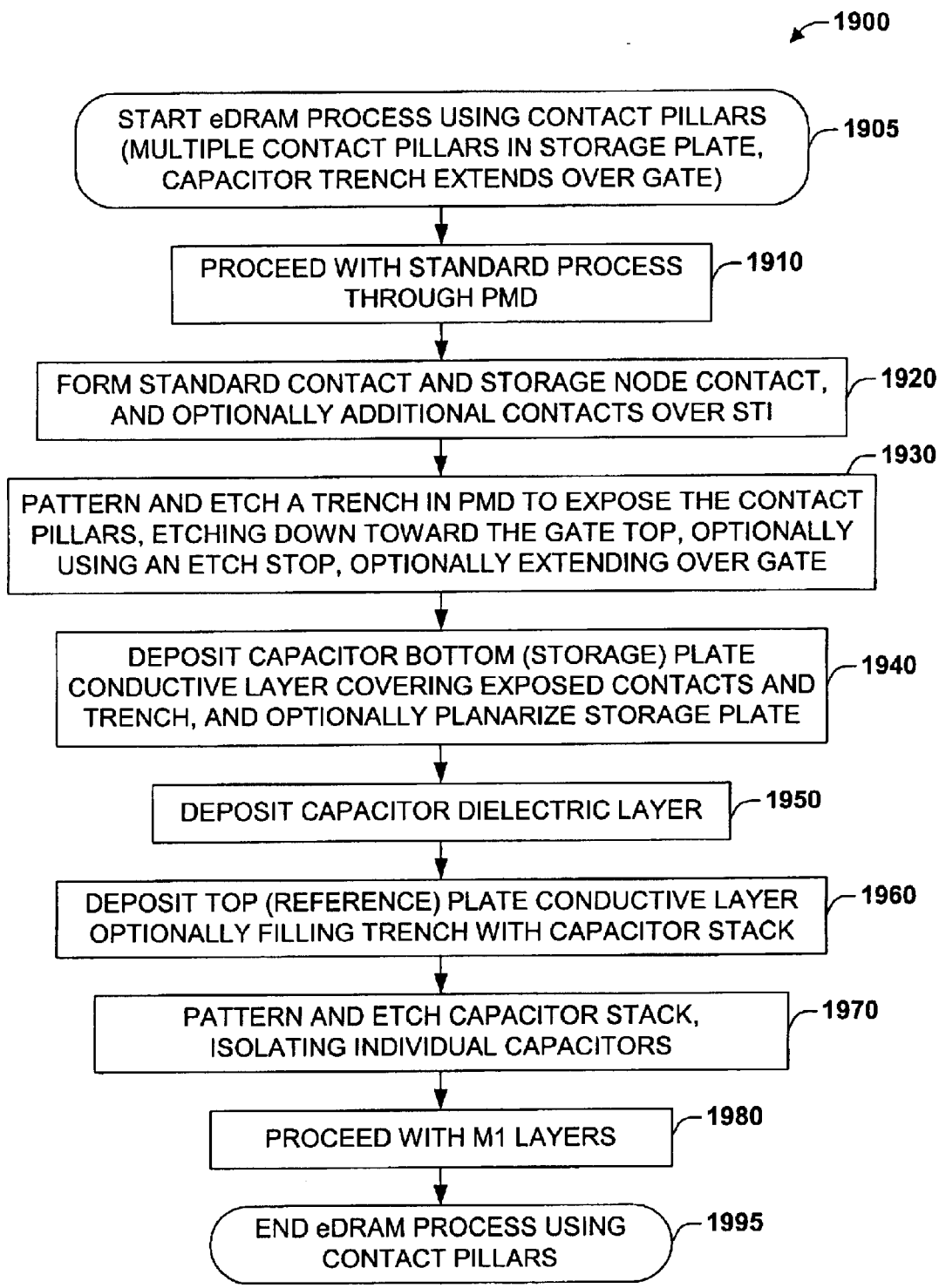
FIG. 28 is a flow diagram illustrating an exemplary method for an eDRAM memory cell fabrication process associated with the structure of FIGS. 22–23 in association with the fifth aspect of the present invention, wherein multiple contact pillars are optionally used in the storage plate, and the capacitor trench optionally extends over the gate.

FIG. 28 is another exemplary flow chart 1900 illustrating an alternate method of forming the capacitor under bit line eDRAM memory cell structures of FIGS. 22 and 23, in association with the fifth aspect of the present invention, wherein multiple contact pillars 225 are used as a portion of the storage plate, the capacitor trench 1310 extends over the gate 215, 1315 and the STI region 260, and M1 forms the ground plate. The eDRAM process method begins at 1905, and proceeds with 1910 through 1920 similar to method 1400 of FIG. 24, 1410 through 1420, wherein the access transistor and the contacts are formed, for example, bit line contact pillar 230 and (e.g., two) storage contact pillars 225 of the contact conductive material, at 1420, and as such need not be described again.

At 1930 a capacitor trench 1310 is formed in the PMD layer 265, as depicted by FIGS. 22 and 23, etching down toward (e.g., about 0.4 to 0.5 microns) the gate 215 to an etch stop layer 1365 (e.g., a nitride) which overlays the gate 215 and 1315, wherein the etch stop layer 1365 is deposited before the PMD layer 265. Optionally, the depth of the capacitor trench 1310, may approach the substrate 202, for increased surface area, depending on the relative selectivity of the etch stop layer 1365 covering the gate. The capacitor trench 1310 thus formed in the PMD exposes multiple contact pillars 225, which are used in the storage plate, and the capacitor trench optionally extends over the gate 215 and an adjacent memory cell gate 1315.

At 1940, the capacitor bottom (storage) plate conductive layer 1366 is deposited over the exposed storage contact pillars 225, the walls and floor of the capacitor trench 1310 forming one plate of the memory cell capacitor stack. Optionally, the storage plate 1366 is planarized.

At 1950, a (e.g., thin) capacitor dielectric layer, for example 1367 of FIG. 23, of a dielectric material is deposited over the storage plate conductive layer 1366 within the capacitor trench 1310.

At 1960 a conductive material layer, for example, the ground (reference) plate 1368 of FIG. 23, is deposited over the capacitor dielectric layer 1367 forming the capacitor stack. Optionally, the capacitor stack will completely fill the capacitor trench 1310, and for example, the lower portions of the M1 dielectric layer 280 illustrated within the trench in FIG. 23. Optionally, the bottom and top plate conductive layers (1366 and 1368) may be comprised of the same material.

Portions of the capacitor stack are removed at 1970 to form an isolated individual capacitor stack.

Finally, at 1980, the method proceeds as before at 1480 of FIG. 24 of the method 1400, wherein the M1 dielectric material layer 280 is deposited and openings are formed for the bit line contact 218 and the ground plate contact 1375 of FIG. 23. A layer of the M1 conductive material layer is then deposited through the openings in the M1 dielectric material layer 280. Thereafter the eDRAM process method ends at 1995, whereupon standard back end logic processes may continue, and the method 1900 may be repeated for the formation of subsequent memory cell structures, wherein multiple contact pillars are used in the storage plate, the trench extends over the gates, and for example, the M1 material forms the ground plate contact 1375.

Alternatively, after depositing the storage plate conductor of the capacitor stack (e.g., 1940), a planarization (e.g., CMP) may be done to remove the storage plate material that is on top of the PMD. This isolates the storage plate conductors in the individual capacitor cups (trenches). Then the process proceeds with the deposition (similar to 1950) of the capacitor dielectric and the top (ground) plate conductor (similar to 1960). Finally, the top plate conductor would then be patterned and etched, permitting the top plates to be continuous across adjacent memory cells.

The methodologies 1400, 1500, 1600, 1700, and 1900 thus provide for a capacitor under bit line eDRAM memory cell, wherein a three dimensional CUB capacitor is formed in a trench within the PMD layer of a standard logic device manufactured utilizing contact pillar structures, and may be processed using standard logic processes for producing a small memory device, which is simple in design. The eDRAM memory cell structure of the present invention comprises two basic electrical components; an access transistor 208, and a memory storage capacitor generally formed in a capacitor region 210 within the PMD layer 265.

In accordance with various aspects of the present invention, contact pillars may be utilized to form the storage plate or the ground plate of the storage capacitor. A thin deposition of $Ta_2O_5$, $TiO_2$, or BST, or another similar capacitor dielectric material, forms the capacitor dielectric material layer 270. The ground plate or the storage plate conductive material including the contact pillars used as a capacitor plate, may include a variety of conductive materials, for example, tungsten, aluminum, or copper with a tantalum nitride migration barrier layer.

In accordance with another aspect of the invention, the memory cell capacitor generally resides over the active areas of the substrate, thereby reducing the SEU cross-section, and minimizing random errors and losses of data.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. An embedded DRAM memory cell, comprising:
    an access transistor, the access transistor comprising:
        a source and a drain within a substrate, and having a channel region therebetween; and
        a gate dielectric and a gate electrode overlying the channel region, the gate electrode forming a portion of a word line associated with the DRAM memory cell;
    the access transistor covered by a first insulating layer;
    a bit line contact pillar extending through the first insulating layer and contacting the drain of the access transistor, the bit line contact pillar composed of a contact conductive material;
    a three dimensional capacitor structure comprising:
        a storage plate comprising a storage contact pillar residing within a trench formed in the first insulating layer, and coupled to the source of the access transistor, and laterally spaced away from a side wall of the trench; and
        a capacitor dielectric layer overlaying the trench and the storage contact pillar within the trench; and
        a ground plate overlying the capacitor dielectric layer;
    a second insulating layer overlying the access transistor, and having a first opening overlying the bit line contact pillar and a second opening overlying the trench; and
    a conductive material within the first and second openings, respectively, wherein the conductive material within the first opening comprises a bit line contact and the conductive material within the second opening comprises the ground plate of the three dimensional capacitor structure.

2. The memory cell of claim 1, wherein the capacitor further comprises an overlying insulating dielectric layer.

3. The memory cell of claim 1, wherein the capacitor comprises multiple storage contact pillars.

4. The memory cell of claim 1, wherein the contact conductive material and the conductive material comprise substantially one material.

5. The memory cell of claim 4, wherein the one material is selected from the group consisting of tungsten, copper, aluminum, and copper overlying a tantalum nitride barrier layer.

6. The memory cell of claim 1, wherein the storage contact pillar comprises the contact conductive material.

7. The memory cell of claim 1, wherein the capacitor dielectric layer of the capacitor comprises tantalum pentoxide.

8. The memory cell of claim 1, wherein the contact conductive material, and the conductive material comprise one of tungsten, copper, aluminum, and copper overlying a tantalum nitride barrier layer.

9. The memory cell of claim 1, wherein the first insulating layer covering the access transistor comprises a PMD layer.

10. The memory cell of claim 1, wherein the conductive material overlying the bit line contact pillar comprises an M1 layer.

11. The memory cell of claim 1, wherein the ground plate of the capacitor provides a structure which is continuous across adjoining cells and connects the adjoining cells.

12. The memory cell of claim 1, wherein the trench formed in the first insulating layer overlaps the transistor gate electrode.

13. An embedded DRAM memory cell, comprising:
an access transistor, the access transistor comprising:
a source and a drain within a substrate, and having a channel region therebetween; and
a gate dielectric and a gate electrode overlying the channel region, the gate electrode forming a portion of a word line associated with the DRAM memory cell;
the access transistor covered by a first insulating layer;
a bit line contact pillar extending through the first insulating layer and contacting the drain of the access transistor, the bit line contact pillar composed of a contact conductive material;
a three dimensional capacitor structure comprising:
a storage plate comprising a storage contact pillar residing within a trench formed in the first insulating layer, and coupled to the source of the access transistor, and laterally spaced away from a side wall of the trench; and
a capacitor dielectric layer overlaying the trench and the storage contact pillar within the trench and defining a ground plate region surrounding the storage contact pillar;
a conductive plate material residing in the ground plate region surrounding the storage contact pillar with the capacitor dielectric layer disposed therebetween, the conductive plate material forming a ground plate for the three dimensional capacitor structure;
a second insulating layer overlying the access transistor and the three dimensional capacitor structure, the second insulating layer having a first opening overlying the bit line contact pillar and a second opening overlying a portion of the ground plate; and
a conductive material within the first and second openings, respectively, wherein the conductive material within the first opening comprises a bit line contact and the conductive material within the second opening comprises a ground plate contact for the ground plate of the three dimensional capacitor structure.

14. The memory cell of claim 13, wherein the capacitor further comprises an overlying insulating dielectric layer.

15. The memory cell of claim 13, wherein the capacitor comprises multiple storage contact pillars.

16. The memory cell of claim 13, wherein the contact conductive material and the conductive material comprise substantially one material.

17. The memory cell of claim 16, wherein the one material is selected from the group consisting of tungsten, copper, aluminum, and copper overlying a tantalum nitride barrier layer.

18. The memory cell of claim 13, wherein the storage contact pillar comprises the contact conductive material.

19. The memory cell of claim 13, wherein the capacitor dielectric layer of the capacitor comprises tantalum pentoxide.

20. The memory cell of claim 13, wherein the contact conductive material, the conductive material and the conductive plate material comprise one of tungsten, copper, aluminum, and copper overlying a tantalum nitride barrier layer.

21. The memory cell of claim 13, wherein the first insulating layer covering the access transistor comprises a PMD layer.

22. The memory cell of claim 13, wherein the conductive material overlying the bit line contact pillar comprises an M1 layer.

23. The memory cell of claim 13, wherein one plate of the three dimensional capacitor comprises a laterally extending, non-linear pattern to increase capacitor surface area.

24. The memory cell of claim 13, wherein the memory cell has a portion of the storage contact pillar which extends into a region of the first insulating layer which is not removed, whereby structural strength of the cell is improved during processing.

25. The memory cell of claim 13, wherein the ground plate of the capacitor provides a structure which is continuous across adjoining cells and connects the adjoining cells.

26. The memory cell of claim 13, wherein the trench formed in the first insulating layer overlaps the transistor gate electrode.

27. An embedded DRAM memory cell, comprising:
an access transistor, the access transistor comprising:
a source and a drain within a substrate, and having a channel region therebetween; and
a gate dielectric and a gate electrode overlying the channel region, the gate electrode forming a portion of a word line associated with the DRAM memory cell;
the access transistor covered by a first insulating layer;
a bit line contact pillar extending through the first insulating layer and contacting the drain of the access transistor, the bit line contact pillar composed of a contact conductive material;
a storage contact pillar extending through the first insulating layer and contacting the source of the access transistor;
a three dimensional capacitor structure comprising:
an active region formed in the substrate and electrically isolated from the source and drain of the access transistor, the active region comprising a ground plate region of the capacitor structure;
a ground plate contact pillar residing within a trench formed in the first insulating layer, the ground plate contact pillar composed of the contact conductive material, and laterally spaced away from a side wall of the trench; and
a capacitor dielectric layer overlaying the trench and the ground plate contact pillar within the trench and defining a storage plate region between the sidewall of the trench and the ground plate contact pillar;

a conductive plate material residing in the storage plate region, the conductive plate material forming a storage plate of the capacitor structure;

a second insulating layer overlying the access transistor and the three dimensional capacitor structure, the second insulating layer having a first opening overlying the bit line contact pillar and a second opening overlying both the storage contact pillar and the storage plate; and a conductive material within the first and second openings, wherein the conductive material within the first opening comprises a bit line contact and the conductive material within the second opening comprises an electrical connection between the source of the access transistor and the storage plate of the capacitor structure.

28. The memory cell of claim 27, wherein the capacitor further comprises an overlying insulating dielectric layer.

29. The memory cell of claim 27, wherein the capacitor comprises multiple storage contact pillars.

30. The memory cell of claim 27, wherein the contact conductive material and the conductive material comprise substantially one material.

31. The memory cell of claim 30, wherein the one material is selected from the group consisting of tungsten, copper, aluminum, and copper overlying a tantalum nitride barrier layer.

32. The memory cell of claim 27, wherein the storage contact pillar comprises the contact conductive material.

33. The memory cell of claim 27, wherein the capacitor dielectric layer of the capacitor comprises tantalum pentoxide.

34. The memory cell of claim 27, wherein the contact conductive material, the conductive material and the conductive plate material comprise one of tungsten, copper, aluminum, and copper overlying a tantalum nitride barrier layer.

35. The memory cell of claim 27, wherein the first insulating layer covering the access transistor comprises a PMD layer.

36. The memory cell of claim 27, wherein the conductive material overlying the bit line contact pillar comprises an M1 layer.

37. The memory cell of claim 27, wherein one plate of the three dimensional capacitor comprises a laterally extending, non-linear pattern to increase capacitor surface area.

38. The memory cell of claim 27, wherein the ground plate contact pillar of the capacitor provides a structure which is continuous across adjoining cells and connects the adjoining cells.

39. The memory cell of claim 27, wherein the trench formed in the first insulating layer overlaps the transistor gate electrode.

40. The memory cell of claim 39, wherein the conductive material, deposited through an additional opening in the second insulating layer to the ground plate contact pillar, provides a contact to supply an electrical connection to the ground plate which is continuous across adjoining cells and connects the adjoining cells.

* * * * *